(12) United States Patent
Kim et al.

(10) Patent No.: US 11,925,045 B2
(45) Date of Patent: Mar. 5, 2024

(54) LIGHT EMITTING DEVICE AND DISPLAY PANEL INCLUDING SAME

(71) Applicant: Samsung Display Co., Ltd., Yongin-si (KR)

(72) Inventors: Seulong Kim, Cheonan-si (KR); Taekyung Kim, Yongin-si (KR); Pilgu Kang, Hwaseong-si (KR); Jiyoung Kwon, Uijeongbu-si (KR); Eungyoung Park, Gwangju (KR); Jiyoung Song, Bucheon-si (KR); Soon-Chul Chang, Seoul (KR); Dongseob Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 16 days.

(21) Appl. No.: 16/881,591

(22) Filed: May 22, 2020

(65) Prior Publication Data
US 2021/0013440 A1 Jan. 14, 2021

(30) Foreign Application Priority Data

Jul. 12, 2019 (KR) .......................... 10-2019-0084612

(51) Int. Cl.
*H10K 50/13* (2023.01)
*H10K 50/18* (2023.01)
(Continued)

(52) U.S. Cl.
CPC ........... *H10K 50/13* (2023.02); *H10K 50/156* (2023.02); *H10K 50/157* (2023.02);
(Continued)

(58) Field of Classification Search
CPC ............. H01L 27/3209; H01L 51/5064; H01L 51/5068; H01L 51/508; H01L 51/5092;
(Continued)

(56) References Cited

U.S. PATENT DOCUMENTS 6,566,807 B1 * 5/2003 Fujita .................. H01L 51/5012
428/917
8,877,350 B2 11/2014 Spindler et al.
(Continued)

FOREIGN PATENT DOCUMENTS

CN 109273614 A * 1/2019
CN 109273614 A * 1/2019
(Continued)

OTHER PUBLICATIONS

Kim, Y. et al., "Effect of hole-blocking layer doped with electron-transport molecules on the performance of blue organic light-emitting device", phys. stat. sol. (a) 201, No. 9, 2148-2153 (2004) / DOI 10.1002/pssa.200406830 (6 pages).
(Continued)

*Primary Examiner* — Mohammad A Rahman
(74) *Attorney, Agent, or Firm* — Lewis Roca Rothgerber Christie LLP

(57) ABSTRACT

A light emitting device includes a first electrode, a first stack on the first electrode, a first charge generation layer on the first stack, a second stack on the first charge generation layer, and a second electrode on the second stack. The first stack includes a first light emitting layer and a plurality of first organic layers, and the second stack includes a second light emitting layer and a plurality of second organic layers. Among the plurality of first organic layers and the plurality of second organic layers, at least one of organic layers adjacent to the first light emitting layer and the second light emitting layer includes a light emitting material.

15 Claims, 12 Drawing Sheets

(51) Int. Cl.
*H10K 50/15* (2023.01)
*H10K 50/16* (2023.01)
*H10K 50/17* (2023.01)
*H10K 50/805* (2023.01)
*H10K 59/32* (2023.01)

(52) U.S. Cl.
CPC ......... *H10K 50/166* (2023.02); *H10K 50/171* (2023.02); *H10K 50/18* (2023.02); *H10K 50/805* (2023.02); *H10K 59/32* (2023.02)

(58) Field of Classification Search
CPC ............. H01L 51/5096; H01L 51/5203; H01L 51/0052; H01L 51/006; H01L 51/0067; H01L 51/0073; H01L 51/5278; H01L 51/0085; H01L 51/504–5044; H01L 51/5048–5084; H01L 51/5056–5068; H01L 51/5072–5084; H01L 51/5012
See application file for complete search history.

(56) References Cited

U.S. PATENT DOCUMENTS

| | | | |
|---|---|---|---|
| 9,711,745 B2 | 7/2017 | Yamazaki | |
| 2007/0235742 A1* | 10/2007 | Tobise | H01L 51/5012 257/79 |
| 2013/0153881 A1 | 6/2013 | Tokoo et al. | |
| 2015/0034923 A1* | 2/2015 | Kim | H01L 27/3209 257/40 |
| 2016/0118612 A1* | 4/2016 | Park | H10K 50/19 257/40 |
| 2016/0322568 A1 | 11/2016 | Fadhel et al. | |
| 2017/0092888 A1* | 3/2017 | Han | H01L 51/5044 |
| 2017/0162829 A1* | 6/2017 | Lai | H01L 51/5218 |
| 2017/0194387 A1* | 7/2017 | Oh | H10K 50/19 |
| 2017/0301881 A1* | 10/2017 | Archer | H10K 85/111 |
| 2018/0006260 A1 | 1/2018 | Yoon et al. | |
| 2018/0090718 A1* | 3/2018 | Lee | H10K 50/858 |
| 2019/0036032 A1 | 1/2019 | Denker et al. | |
| 2020/0365810 A1* | 11/2020 | Luschtinetz | C07D 251/24 |
| 2021/0104697 A1* | 4/2021 | Ohsawa | G09F 9/30 |
| 2021/0210708 A1* | 7/2021 | Ganier | H01L 51/0003 |
| 2021/0351370 A1* | 11/2021 | Zhang | H01L 51/5056 |

FOREIGN PATENT DOCUMENTS

| | | |
|---|---|---|
| KR | 10-1262758 B1 | 5/2013 |
| KR | 10-2016-0008946 A | 1/2016 |
| KR | 10-1614403 B1 | 4/2016 |
| KR | 10-2016-0102529 A | 8/2016 |
| KR | 10-2018-0003710 A | 1/2018 |
| KR | 10-2018-0019731 A | 2/2018 |
| KR | 10-2018-0099996 A | 9/2018 |
| WO | 03/022007 A1 | 3/2003 |

OTHER PUBLICATIONS

Wang, Pei et al., "Optimization for tandem organic light-emitting diodes based on Firpic", Optoelectron. Lett. vol. 14 No. 5, 0350-0354 (5 pages).

* cited by examiner

LIGHT EMITTING DEVICE AND DISPLAY PANEL INCLUDING SAME

CROSS-REFERENCE TO RELATED APPLICATION

This application claims priority to and the benefit of Korean Patent Application No. 10-2019-0084612, filed on Jul. 12, 2019, the entire content of which is hereby incorporated by reference.

BACKGROUND

One or more aspects of embodiments of the present disclosure herein are directed toward a light emitting device and a display panel including the same. More specifically, aspects of the present disclosure herein relate to a light emitting device having improved light emitting efficiency and device lifespan by preventing (or reducing) damage to an organic layer, and a display panel including the same.

An organic light emitting device is a self-luminous device having a short response time and driven by a low voltage. Accordingly, an organic light emitting display device including the organic light emitting device may not include a separate light source, and thus, may be made to be lightweight and thin, and have a number of advantages such as having excellent luminance and/or no viewing angle dependency.

The organic light emitting device may include a light emitting layer made of an organic matter (organic material) between an anode and a cathode. A hole provided from the anode and an electron provided from the cathode are combined in the light emitting layer to form an exciton, and light corresponding to the energy between the hole and the electron is generated from the exciton when the exciton transitions from an excited state to a ground state.

A tandem organic light emitting device has a structure including (e.g., consisting of) two or more stacks of a hole injection layer/a hole transport layer/a light emitting layer/an electron transport layer/an electron injection layer (in each stack) between an anode and a cathode, and a charge generation layer, which assists in the generation and movement of charges is present between each stack.

SUMMARY

One or more aspects of embodiments of the present disclosure are directed to a light emitting device having improved light emitting efficiency and device lifespan by preventing (or reducing) damage to an organic layer adjacent to a light emitting layer.

Aspects of the present disclosure are also directed to a display device having increased light conversion efficiency, thereby having increased overall light efficiency, by including a light emitting device with improved light emitting efficiency.

An embodiment of the present disclosure provides a light emitting device including a first electrode, a first stack on the first electrode, a first charge generation layer on the first stack, a second stack on the first charge generation layer, and a second electrode on the second stack. In an embodiment, the first stack may include a first light emitting layer and a plurality of first organic layers, and the second stack may include a second light emitting layer and a plurality of second organic layers. In an embodiment, among the plurality of first organic layers and the plurality of second organic layers, at least one of organic layers adjacent to the first light emitting layer and the second light emitting layer may include a light emitting material.

In an embodiment, the first stack may include a first hole transport region between the first electrode and the first light emitting layer and a first electron transport region between the first light emitting layer and the first charge generation layer. In an embodiment, the second stack may include a second hole transport region between the first charge generation layer and the second light emitting layer and a second electron transport region between the second light emitting layer and the second electrode. In an embodiment, each of the first hole transport region, the first electron transport region, the second hole transport region, and the second electron transport region may include at least one organic layer. In an embodiment, an organic layer adjacent to the first light emitting layer among organic layers of the first hole transport region and the first electron transport region may include the light emitting material, and an organic layer adjacent to the second light emitting layer among organic layers of the second hole transport region and the second electron transport region may include the light emitting material.

In an embodiment, each of the first hole transport region and the second hole transport region may include at least one selected from a hole injection layer and a hole transport layer. In an embodiment, each of the first electron transport region and the second electron transport region may include at least one selected from an electron injection layer and an electron transport layer. In an embodiment, among the hole injection layer, the hole transport layer, the electron injection layer, and the electron transport layer, at least one layer adjacent to the first light emitting layer or the second light emitting layer may include the light emitting material.

In an embodiment, the first hole transport region may include a first hole injection layer and a first hole transport layer between the first hole injection layer and the first light emitting layer. In an embodiment, the first electron transport region may include a first electron injection layer and a first electron transport layer between the first electron injection layer and the first light emitting layer. In an embodiment, the second hole transport region may include a second hole injection layer and a second hole transport layer between the second hole injection layer and the second light emitting layer. In an embodiment, the second electron transport region may include a second electron injection layer and a second electron transport layer between the second electron injection layer and the second light emitting layer. In an embodiment, at least one selected from the first hole transport layer, the first electron transport layer, the second hole transport layer, and the second electron transport layer may include the light emitting material.

In an embodiment, the first hole transport region may include a first hole injection layer, a first hole transport layer between the first hole injection layer and the first light emitting layer, and a first electron blocking layer between the first hole transport layer and the first light emitting layer. In an embodiment, the first electron transport region may include a first electron injection layer, a first electron transport layer between the first electron injection layer and the first light emitting layer, and a first hole blocking layer between the first electron transport layer and the first light emitting layer. In an embodiment, the second electron transport region may include a second electron injection layer, a second electron transport layer between the second electron injection layer and the second light emitting layer, and a second hole blocking layer between the second electron transport layer and the second light emitting layer. In an embodiment, the second electron transport region may include a second electron injection layer, a second electron transport layer between the second electron injection layer and the second light emitting layer, and a second hole blocking layer between the second electron transport layer and the second light emitting layer. In an embodiment, at least one selected from the first electron blocking layer, the first hole blocking layer, the second electron blocking layer, and the second hole blocking layer may include the light emitting material.

In an embodiment, each of the first electron blocking layer, the first hole blocking layer, the second electron blocking layer, and the second hole blocking layer may include the light emitting material.

In an embodiment, the light emitting device may further include a second charge generation layer on the second stack, and a third stack on the second charge generation layer.

In an embodiment, the first light emitting layer and the second light emitting layer may generate blue light.

In an embodiment, the light emitting material may be a material which can generate green light, red light, and/or orange light.

In an embodiment, the organic layer including the light emitting material may include a base substance and the light emitting material doped in the base substance.

In an embodiment, the base substance may have a lowest triplet excitation energy level (T1) higher than that of the light emitting material.

In an embodiment, the light emitting material may be a phosphorescent light emitting material.

In an embodiment, the first electrode may be a reflective electrode, and the second electrode may be either a transmissive electrode or a transflective electrode.

In an embodiment, the light emitting device may further include a capping layer on the second electrode.

In an embodiment of the present disclosure, a light emitting device includes a first electrode, a hole transport region on the first electrode and including at least one organic layer, a light emitting layer on the hole transport region and including a first light emitting material, an electron transport region on the light emitting layer and including at least one organic layer, and a second electrode on the electron transport region. In an embodiment, an organic layer selected from among organic layers of the hole transport region and the electron transport region that is in contact with the light emitting layer may include a second light emitting material different from the first light emitting material.

In an embodiment, the hole transport region may include a hole injection layer, a hole transport layer between the hole injection layer and the light emitting layer, and an electron blocking layer between the hole transport layer and the light emitting layer. In an embodiment, the electron transport region may include an electron injection layer, an electron transport layer between the electron injection layer and the light emitting layer, and a hole blocking layer between the electron transport layer and the light emitting layer, and the electron blocking layer and the hole blocking layer may include the second light emitting material.

In an embodiment, the second light emitting material may generate light of a higher wavelength than that of the first light emitting material.

In an embodiment, the organic layer including the second light emitting material may be formed of a base substance doped with the second light emitting material.

In an embodiment, a charge generation layer, a second hole transport region, a second light emitting layer, and a second electron transport region may be sequentially stacked between the electron transport region and the second electrode. In an embodiment, the second hole transport region and the second electron transport region may include at least one organic layer. In an embodiment, a layer adjacent to the second light emitting layer may include a third light emitting layer different from the first light emitting material.

In an embodiment, the third light emitting material may be the same material as the second light emitting material.

In an embodiment of the present disclosure, a display panel includes a base substrate having a pixel region and a peripheral region adjacent to the pixel region, and a plurality of display elements on the base substrate so as to overlap the pixel region on a plane. In an embodiment, each of the plurality of display elements may include a first electrode, a first stack on the first electrode, a first charge generation layer on the first stack, a second stack on the first charge generation layer, and a second electrode on the second stack. In an embodiment, the first stack may include a first light emitting layer and at least one first organic layer, and the second stack may include a second light emitting layer and at least one second organic layer, and at least one selected from the first organic layer and the second organic layer that is adjacent to the first light emitting layer and the second light emitting layer may include a light emitting material.

In an embodiment, a display panel may further include a light control layer on the plurality of display elements and overlapping the pixel region on a plane.

In an embodiment, the plurality of display elements may generate a first light, and the light control layer may include a first light control unit to transmit the first light, a second light control unit to convert the first light into a second light, and a third light control unit to convert the first light into a third light.

In an embodiment, the first light may be light having a wavelength region of 410 nm to 480 nm, the second light may be light having a wavelength region of 500 nm to 570 nm, and the third light may be light having a wavelength region of 625 nm to 675 nm.

In an embodiment, the light control layer may include a base resin and a light emitting body dispersed in the base resin.

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
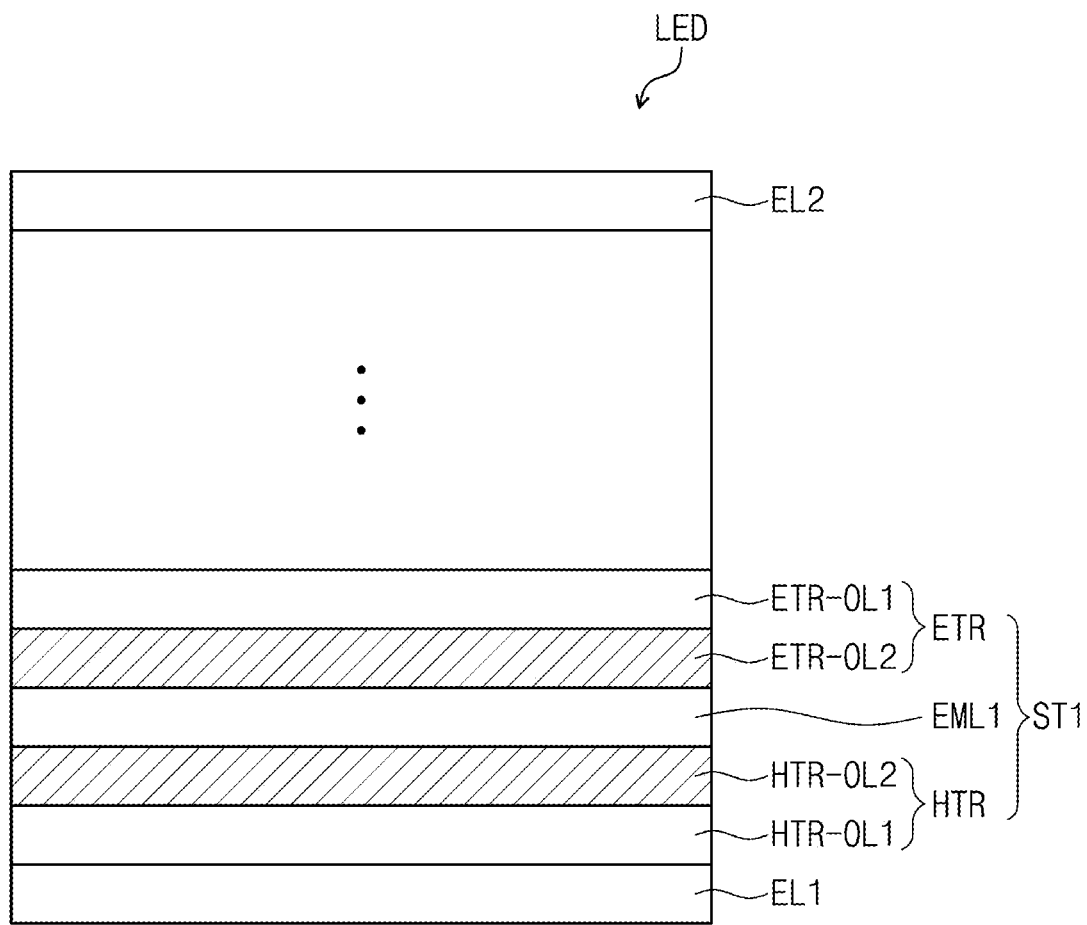
FIG. 1 is a cross-sectional view schematically showing a light emitting device according to an embodiment of the present disclosure.

Hereinafter, embodiments of the present disclosure will be described in more detail with reference to the accompanying drawings. The present disclosure may be modified in many alternate forms, and thus specific embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the invention.

Like reference numerals are used to refer to like elements in describing each drawing. In the accompanying drawings, the dimensions of elements may be exaggerated for clarity of the present disclosure. It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In the present disclosure, it should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

In the present disclosure, if a portion such as a layer, a film, a region, or a plate is referred to as being "on" or "above" the other portion, it includes not only the case in which the portion is "directly on" the other portion, but also the case in which another portion is disposed therebetween. Similarly, when a portion such as a layer, a film, a region, or a plate is referred to as being "under" or "below" the other portion, it includes not only the case in which the portion is "directly under" the other portion, but also the case in which another portion is disposed therebetween. In addition, in the present disclosure, being disposed "on" not only includes the case of being disposed above, but also the case of being disposed below.

Meanwhile, in the present disclosure, "being in direct contact" (when used in connection with two or more elements) means that there is no layer, film, region, plate or the like added between the two or more elements. For example, "being in direct contact" may mean disposing two layers or two members, without additional members such as an adhesive member therebetween.

Hereinafter, a light emitting device and a display panel according to an embodiment of the present disclosure will be described with reference to the accompanying drawings.

FIG. 1 is a cross-sectional view schematically showing a light emitting device according to an embodiment of the present disclosure.

Referring to FIG. 1, a light emitting device LED according to an embodiment of the present disclosure includes a first electrode EL1, a first stack ST1 disposed on the first electrode EL1, and a second electrode EL2 disposed on the first stack ST1. The light emitting device LED may be provided on a base substrate.

In the light emitting device LED according to an embodiment of the present disclosure, the first electrode EU corresponds to a reflective electrode. The first electrode EL1 may be, for example, an anode. When the first electrode EL1 is an anode, the first electrode EL1 may be formed of a metal having a high work function, such as Ag, Mg, Al, Pt, Pd, Au, Ni, Nd, Ir, Cr, and/or the like, or may include a mixture thereof. In some embodiments, the first electrode EL1 may be a metal monolayer including a metal such as Ag, Mg, Al, Pt, Pd, Au, Ni, Nd, Ir, Cr, and/or the like or a mixture thereof, or may have a multi-layered structure of a metal layer (including a metal such as Ag, Mg, Al, Pt, Pd, Au, Ni, Nd, Ir, Cr, and/or the like or a mixture thereof) and a transparent conductive oxide layer (including a transparent conductive oxide). The transparent conductive oxide may include, for example, indium tin oxide (ITO), indium zinc oxide (IZO), zinc oxide (ZnO), indium tin zinc oxide (ITZO), and/or the like. In an embodiment, the first electrode EU may have a triple layer structure of ITO/Ag/ITO. However, the embodiment of the present disclosure is not limited thereto.

The first electrode EL1 may be, for example, a cathode. When the first electrode EL1 is a cathode, the first electrode EL1 may include a lanthanide metal having a low work function such as Li, Ca, LiF/Ca, LiF/Al, Al, Mg, BaF, Ba, Ag, Yb, and/or the like, or a compound or a mixture thereof. In an embodiment, the first electrode EL1 may be Ag/Mg or Ag/Yb, but the embodiment of the present disclosure is not limited thereto. The first electrode EL1 may be formed thick enough to reflect light.

In the light emitting device LED according to an embodiment of the present disclosure, the second electrode EL2 may correspond to either a transmissive electrode or a transflective electrode. The second electrode EL2 may be, for example, a cathode. When the second electrode EL2 is a cathode, the second electrode EL2 may include a lanthanide metal having a low work function such as Li, Ca, LiF/Ca, LiF/Al, Al, Mg, BaF, Ba, Ag, Yb, and/or the like, or a compound or a mixture thereof. In an embodiment, the second electrode EL2 may be Ag/Mg or Ag/Yb, but the embodiment of the present disclosure is not limited thereto. The second electrode EL2 may be formed thin enough to transmit light.

The second electrode EL2 may be, for example, an anode. The second electrode EL2 may include a transparent conductive oxide having a high work function. For example, the second electrode EL2 may include indium tin oxide (ITO), indium zinc oxide (IZO), zinc oxide (ZnO), indium tin zinc oxide (ITZO), and/or the like. In an embodiment, the second electrode EL2 may have a triple layer structure of ITO/Ag/ITO. However, the embodiment of the present disclosure is not limited thereto.

The light emitting device LED according to an embodiment of the present disclosure may be of a top emission light emitting device. In this case, the first electrode EL1 may be an anode and the second electrode EL2 may be a cathode. The light emitting device LED according to another embodiment of the present disclosure may be of a bottom emission light emitting device. In this case, the first electrode EL1 may be a cathode and the second electrode EL2 may be an anode. In the light emitting device LED according to an embodiment of the present disclosure, the first electrode EL1 may be a reflective electrode and the second electrode may be either a transmissive electrode or a transflective electrode, so that the light emitting device LED emits light in the direction from the first electrode EL1 to the second electrode EL2. Hereinafter, a case in which the light emitting device LED is of a top emission light emitting device will be described.

The first stack ST1 may include a hole transport region HTR, a light emitting layer EML1 disposed (positioned) on the hole transport region HTR, and an electron transport region ETR disposed on the light emitting layer EML1. The hole transport region HTR may include at least one of organic layers HTR-OL1 or HTR-OL2. The hole transport region HTR may have a multi-layered structure having a plurality of layers each formed of a plurality of different materials. FIG. 1 illustrates the hole transport region HTR of the first stack ST1 including a plurality of organic layers HTR-OL1 and HTR-OL2, but the embodiment of the present disclosure is not limited thereto. The hole transport region HTR may include one organic layer.

The electron transport region ETR may include at least one of organic layers ETR-OL1 or ETR-OL2. The electron transport region ETR may have a multi-layered structure having a plurality of layers each formed of a plurality of different materials. FIG. 1 illustrates the electron transport region ETR of the first stack ST1 including a plurality of organic layers ETR-OL1 and ETR-OL2, but the embodiment of the present disclosure is not limited thereto. The electron transport region ETR may include one organic layer.

The light emitting layer EML1 may have a thickness of about 100 Å to about 1000 Å, or about 100 Å to about 300 Å. The light emitting layer EML1 may include a low-molecular organic matter (organic material) or a polymer organic matter (polymer organic material) as a light emitting material. The light emitting layer EML1 may include a host material and a dopant material. The light emitting layer EML1 may be formed by using a phosphorescent and/or a fluorescent light emitting material as a dopant in the host material. The light emitting layer EML1 may be formed by including a thermally activated delayed fluorescence (TADF) dopant in the host material. In some embodiments, the light emitting layer EML1 may include a quantum dot material as the light emitting material. A core of a quantum dot may be selected from a Group II-VI compound, a Group III-V compound, a Group IV-VI compound, a Group IV element, a Group IV compound, and combinations thereof.

The color of light emitted from the light emitting layer EML1 may be determined based on the combination of the host material and the dopant material, the type of the quantum dot material and the size of the core, and/or the like. In an embodiment, the light emitting layer EML1 may generate blue light, and the blue light may be light having a wavelength of 410 nm to 480 nm. The light emission spectrum of the blue light may have a maximum peak within 440 nm to 460 nm.

As the host material of the light emitting layer EML1, any suitable material may be used, and although not particularly limited, the host material may be selected from a fluoranthene derivative, a pyrene derivative, an arylacetylene derivative, an anthracene derivative, a fluorene derivative, a perylene derivative, a chrysene derivative, and the like. In some embodiments, a pyrene derivative, a perylene derivative, and/or an anthracene derivative may be selected.

As the dopant material of the light emitting layer EML1, any suitable material may be used, and although not particularly limited, the dopant material may include a styryl derivative (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or a derivative thereof (for example, 2,5,8,11-Tetra-t-butylperylene (TBP)), pyrene and/or a derivative thereof (for example, 1,1-dipyrene, 1,4-dipyrenylbenzene, 1,4-Bis (N,N-Diphenylamino)pyrene), and/or N1,N6-di(naphthalen-2-yl)-N1,N6-diphenylpyrene-1,6-diamine), and/or the like.

Among the plurality of organic layers included in the hole transport region HTR and the electron transport region ETR, at least one of organic layers HTR-OL2 or ETR-OL2 adjacent to the light emitting layer EML1 includes a light emitting material. In an embodiment, at least one of adjacent organic layers HTR-OL2 or ETR-OL2 may be (e.g., may include) a base substance doped with a light emitting dopant. The base substance may have a lowest triplet excitation energy level (T1) higher than that of the light emitting material.

The light emitting material included in the adjacent organic layers HTR-OL2 and/or ETR-OL2 may be a different material from a light emitting dopant included in the light emitting layer EML1. In an embodiment, the light emitting layer EML1 includes a first light emitting material, and the adjacent organic layers HTR-OL2 and/or ETR-OL2 may include a second light emitting material. In an embodiment, the second light emitting material may be a material which generates light of a higher wavelength when compared with the first light emitting material. In an embodiment, the first light emitting material may be a material which generates blue light, and the second light emitting material may be a material which generates green light, red light, or orange light.

The light emitting material included in the adjacent organic layers HTR-OL2 and/or ETR-OL2 may be a phosphorescent light emitting dopant. The light emitting material included in the adjacent organic layers HTR-OL2 and/or ETR-OL2 may be a phosphorescent light emitting material which generates green light. For example, the light emitting material may include an organic metal complex such as Ir(ppy$_3$)(Tris[2-phenylpyridine]iridium(III)).

The light emitting device according to an embodiment of the present disclosure may include a light emitting material in an organic layer adjacent to a light emitting layer. For example, the light emitting device according to an embodiment may include a light emitting material in a light emitting layer, and may also include a different light emitting material in an organic layer formed to be in contact with the light emitting layer. Accordingly, a base substance material of the organic layer is prevented (or protected) from being deteriorated and damaged due to holes, electrons, and/or the like being leaked into the organic layer adjacent to the light emitting layer, and instead of deteriorating the base substance, a leaked exciton may generate light by the light emitting material of the adjacent organic layer. Accordingly, the durability of the light emitting device including the organic layer may be improved, so that device lifespan may be improved, and additional light emission may be performed due to a leakage current, so that light emission efficiency may be increased.

Figure 2:
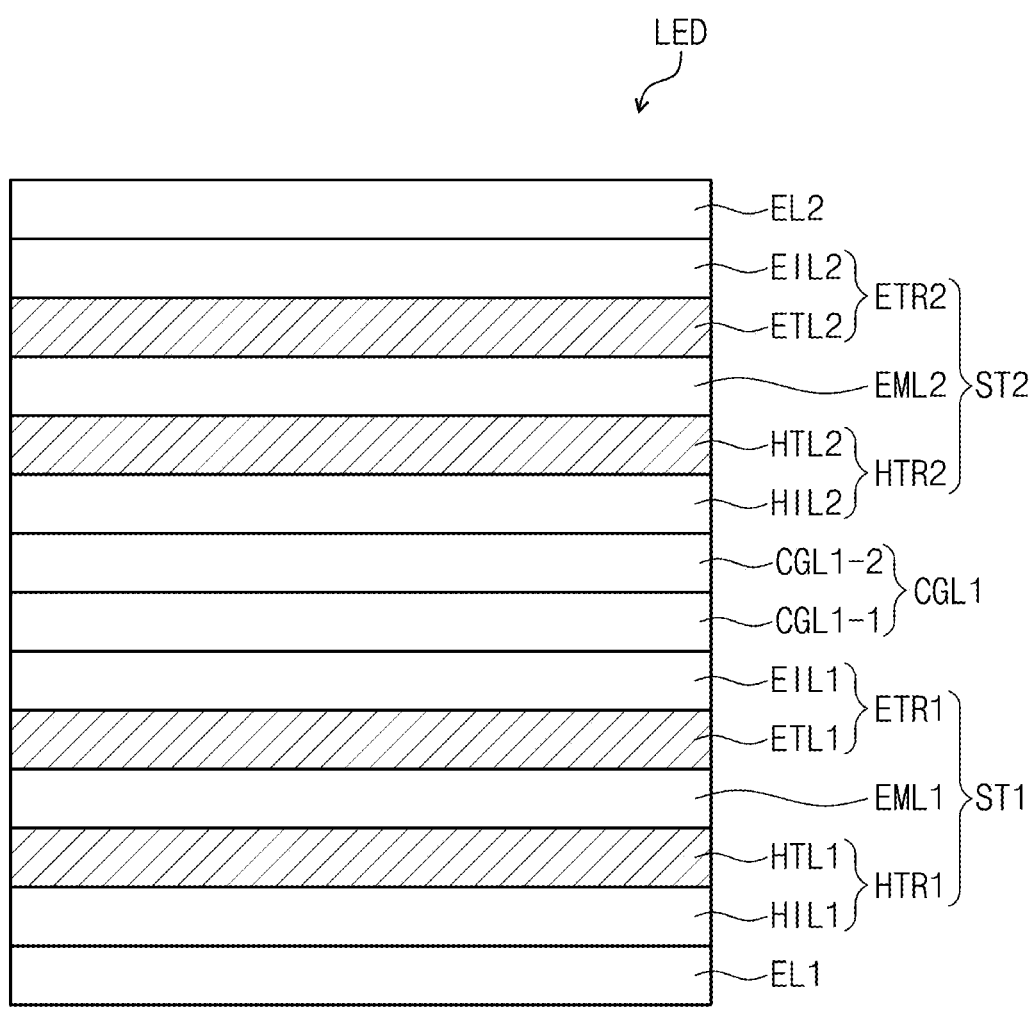
FIG. 2 is a cross-sectional view schematically showing a light emitting device according to an embodiment of the present disclosure.

FIG. 2 is a cross-sectional view schematically showing a light emitting device according to an embodiment of the present disclosure. Hereinafter, in describing the light emitting device of an embodiment of FIG. 2, the same reference numerals are given to the components described above and the descriptions thereof are omitted.

Referring to FIG. 2, the light emitting device LED according to an embodiment of the present disclosure may include the first stack ST1 and a second stack ST2. Between the first stack ST1 and the second stack ST2, a first charge generation layer CGL1 may be disposed.

A first light emitting layer EML1 and a second light emitting layer EML2 may include the light emitting material described above, without limitation. Each of the first light emitting layer EML1 and the second light emitting layer EML2 may generate blue light, and the blue light may be light having a wavelength of 410 nm to 480 nm. The light emission spectrum of the blue light may have a maximum peak within 440 nm to 460 nm.

The first stack ST1 may include the first light emitting layer EML1 for emitting light, a first hole transport region HTR1 for transporting holes provided from the first electrode EL1 to the first light emitting layer EML1, and a first electron transport region ETR1 for transporting electrons generated from the first charge generation layer CGL1 to the first light emitting layer EML1. FIG. 2 illustrates the first hole transport region HTR1 including a first hole injection layer HIL1 and a first hole transport layer HTL1, but the embodiment of the present disclosure is not limited thereto. Any one of the first hole transport layer HTL1 and the first hole injection layer HIL1 may be omitted. In an embodiment, the first hole transport region HTR1 may include only the first hole injection layer HIL1, and the first hole injection layer HIL1 may be in contact with the first light emitting layer EML1. The first electron transport region ETR1 is illustrated as including a first electron injection layer EIL1 and a first electron transport layer ETL1, but the embodiment of the present disclosure is not limited thereto. Any one of the first electron injection layer EIL1 and the first electron transport layer ETL1 may be omitted. In an embodiment, the first electron transport region ETR1 may include only the first electron transport layer ETL1, and the first electron transport layer ETL1 may be in contact with the first light emitting layer EML1 and the first charge generation layer CGL1. The first electron transport layer ETL1 may be provided in a plurality.

The second stack ST2 may include the second light emitting layer EML2 for emitting light, a second hole transport region HTR2 for transporting holes provided from the second electrode EL2 to the second light emitting layer EML2, and a second electron transport region ETR2 for transporting electrons generated from a second charge generation layer CGL2 to the second light emitting layer EML2. FIG. 2 illustrates the second hole transport region HTR2 including a second hole injection layer HIL2 and a second hole transport layer HTL2, but the embodiment of the present disclosure is not limited thereto. Any one of the second hole transport layer HTL2 and the second hole injection layer HIL2 may be omitted. In an embodiment, the second hole transport region HTR2 may include only the second hole injection layer HIL2, and the second hole injection layer HIL2 may be in contact with the second light emitting layer EML2. The second electron transport region ETR2 is illustrated as including a second electron injection layer EIL2 and a second electron transport layer ETL2, but the embodiment of the present disclosure is not limited thereto. Any one of the second electron injection layer EIL2 and the second electron transport layer ETL2 may be omitted. In an embodiment, the second electron transport region ETR2 may include only the second electron transport layer ETL2, and the second electron transport layer ETL2 may be in contact with the second light emitting layer EML2. The second electron transport layer ETL2 may be provided in a plurality.

Each layer of the first hole transport region HTR1 and the second hole transport region HTR2 may be formed using any suitable method. For example, the first hole transport region HTR1 and the second hole transport region HTR2 may be formed by one or more suitable methods such as a vacuum deposition method, a spin coating method, a casting method, a Langmuir-Blodgett (LB) method, an inkjet printing method, a laser printing method, and/or a laser induced thermal imaging (LITI) method.

The first hole injection layer HIL1 and the second hole injection layer HIL2 may include a hole injection material. The hole injection material may include a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino] triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2-TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonic acid (PANI/CSA), Polyaniline)/Poly(4-styrenesulfonate (PANI/PSS), N,N'-di(naphthalene-1-yl)-N,N'-diphenyl-benzidine (NPB), N,N'-Di(1-naphthyl)-N,N'-diphenyl-(1,1'-biphenyl)-4,4'-diamine (NPD), triphenylamine-containing polyether ketone (TPAPEK), 4-Isopropyl-4'-methyldiphenyliodonium [Tetrakis(pentafluorophenyl)borate], dipyrazino[2,3-f: 2',3'-h] quinoxaline-2,3,6,7,10,11-hexacarbonitrile (HAT-CN), and/or the like.

The first hole transport layer HTL1 and the second hole transport layer HTL2 may each independently include a hole transport material. The hole transport material may include a carbazole-based derivative (such as N-phenylcarbazole and/or polyvinylcarbazole), a fluorene-based derivative, a triphenylamine-based derivative (such as N,N'-bis(3-methylphenyl)-N,N'-diphenyl-[1,1-biphenyl]-4,4'-diamine (TPD) and/or 4,4',4"-tris(N-carbazolyl)triphenylamine (TCTA)), N,N'-di(naphthalene-1-yl)-N,N'-diphenyl-benzidine (NPB), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), 1,3-Bis(N-carbazolyl)benzene (mCP), 9-(4-tert-Butylphenyl)-3,6-bis(triphenylsilyl)-9H-carbazole (CzSi), and/or the like.

The thickness of each of the first hole transport region HTR1 and the thickness of the second hole transport region HTR2 may be about 100 Å to about 10000 Å, for example, about 100 Å to about 5000 Å. The thickness of a hole injection layer HIL may be, for example, about 30 Å to about 1000 Å, and the thickness of a hole transport layer HTL may be about 30 Å to about 1000 Å. When the thicknesses of the hole transport region HTR, the hole injection layer HIL, and the hole transport layer HTL satisfy any of the above-described ranges, satisfactory (or suitable) hole transport properties may be obtained without a substantial increase in driving voltage.

The first hole transport region HTR1 and the second hole transport region HTR2 may further include a charge generation material, in addition to the above-mentioned materials, in order to improve conductivity. The charge generation material may be uniformly or non-uniformly dispersed in the first hole transport region HTR1 and the second hole transport region HTR2. The charge generation material may be, for example, a p-dopant. The p-dopant may be one of a quinone derivative, a metal oxide, or a compound containing a cyano group, but the embodiment of the present disclosure is not limited thereto. Non-limiting examples of the p-dopant may include a quinone derivative (such as tetracyanoquinodimethane (TCNQ) and/or 2,3,5,6-tetrafluoro-7,7',8,8'-tetracyanoquinodimethane (F4-TCNQ)), a metal oxide (such as a tungsten oxide and/or a molybdenum oxide), and/or the like, but the embodiment of the present disclosure is not limited thereto.

Each layer of the first electron transport region ETR1 and the second electron transport region ETR2 may be formed using any suitable method. For example, the first electron transport region ETR1 and the second electron transport region ETR2 may each independently be formed by one or more suitable methods such as a vacuum deposition method, a spin coating method, a casting method, a Langmuir-Blodgett (LB) method, an inkjet printing method, a laser printing method, and/or a laser induced thermal imaging (LITI) method.

The first electron injection layer EIL1 and the second electron injection layer EIL2 may include an electron injection material. As the electron injection material, a halogenated metal (such as LiF, NaCl, CsF, RbCl, RbI, and/or CuI), a lanthanide metal (such as Yb), a metal oxide (such as $Li_2O$ and/or BaO), lithium quinolate (LiQ), and/or the like may be used, but the embodiment of the present disclosure is not limited thereto. The first electron injection layer EIL1 and the second electron injection layer EIL2 may each independently be composed of a mixture of an electron injection material and an insulating organo metal salt. The organo metal salt may be a material having an energy band gap of about 4 eV or greater. For example, the organo metal salt may include metal acetate, metal benzoate, metal acetoacetate, metal acetylacetonate, and/or metal stearate. The thickness of each of the first electron injection layer EIL1 and the second electron injection layer EIL2 may be about 1 Å to about 500 Å, or about 3 Å to about 300 Å. When the thicknesses of the first electron injection layers EIL1 and the second electron injection layer EIL2 satisfy any of the above-described ranges, satisfactory (or suitable) electron injection properties may be obtained without a substantial increase in driving voltage.

The first electron transport layer ETL1 and the second electron transport layer ETL2 may each independently include an electron transport material. The electron transport material may include an anthracene-based compound. However, the embodiment of the present disclosure is not limited thereto. The electron transport material may be, for example, Tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tris(1-phenyl-1H-benzo[d]imidazol-2-yl)benzene (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate ($Bebq_2$), 9,10-di(naphthalene-2-yl)anthracene (ADN), diphenyl(4-(triphenylsilyl)phenyl)phosphine oxide (TSPO1), and any compound or mixture thereof. The thickness of each of the first electron transport layer ETL1 and the second electron transport layer ETL2 may be about 100 Å to about 1000 Å, for example, about 150 Å to about 500 Å. When the thicknesses of the first electron transport layer ETL1 and the second electron transport layer ETL2 satisfy any of the above-described ranges, satisfactory (or suitable) electron injection properties may be obtained without a substantial increase in driving voltage.

In the light emitting device LED according to an embodiment, a layer adjacent to each of the first light emitting layer EML1 and the second light emitting layer EML2 may include a light emitting material. In some embodiments, at least one of the first hole transport layer HTL1, the first electron transport layer ETL1, the second hole transport layer HTL2, or the second electron transport layer ETL2 adjacent to any of the first light emitting layer EML1 and the second light emitting layer EML2 may include a light emitting material. In an embodiment, all of the first hole transport layer HTL1, the first electron transport layer ETL1, the second hole transport layer HTL2, and the second electron transport layer ETL2 adjacent to any of the first light emitting layer EML1 and the second light emitting layer EML2 may include a light emitting material. The light emitting materials included in the first hole transport layer HTL1, the first electron transport layer ETL1, the second hole transport layer HTL2, and the second electron transport layer ETL2 may all be the same material.

Each of the first hole transport layer HTL1, the first electron transport layer ETL1, the second hole transport layer HTL2, and the second electron transport layer ETL2 may include a hole transport material or an electron transport material as a base substance, and may be doped with a light emitting material. For example, each of the first hole transport layer HTL1, the first electron transport layer ETL1, the second hole transport layer HTL2, and the second electron transport layer ETL2 may include the hole transport material or the electron transport material as the base substance, and may be doped with a phosphorescent light emitting dopant. The light emitting material included in each of the first hole transport layer HTL1, the first electron transport layer ETL1, the second hole transport layer HTL2, and the second electron transport layer ETL2 may be doped to less than 10% of the total mass of each layer. The light emitting material doped in each of the first hole transport layer HTL1, the first electron transport layer ETL1, the second hole transport layer HTL2, and the second electron transport layer ETL2 may be a material having a lowest triplet excitation energy level T1 lower than that of the hole transport material or the electron transport material that forms the base substance of the corresponding layer.

Between the first stack ST1 and the second stack ST2, the first charge generation layer CGL1 may be provided. When a voltage is applied, the first charge generation layer CGL1 may generate charges (electrons and holes) by forming a complex through an oxidation-reduction reaction. Then, the first charge generation layer CGL1 may provide the generated charges to each of adjacent stacks ST1 and ST2. The first charge generation layer CGL1 may double the efficiency of a current generated in one stack ST1 or ST2, and may serve to control the balance of charges between the first stack ST1 and the second stack ST2.

The first charge generation layer CGL1 may have a layered structure in which a first sub-charge generation layer CGL1-1 and a second sub-charge generation layer CGL1-2 are bonded to each other. As an example, the first sub-charge generation layer CGL1-1 may be an n-type charge generation layer which may provide electrons to the first stack ST1 by being disposed adjacent to the first stack ST1. The second sub-charge generation layer CGL1-2 may be a p-type charge generation layer which may provide holes to the second stack ST2 by being disposed adjacent to the second stack ST2. Between the first sub-charge generation layer CGL1-1 and the second sub-charge generation layer CGL1-2, a buffer layer may be further disposed.

Figure 3:
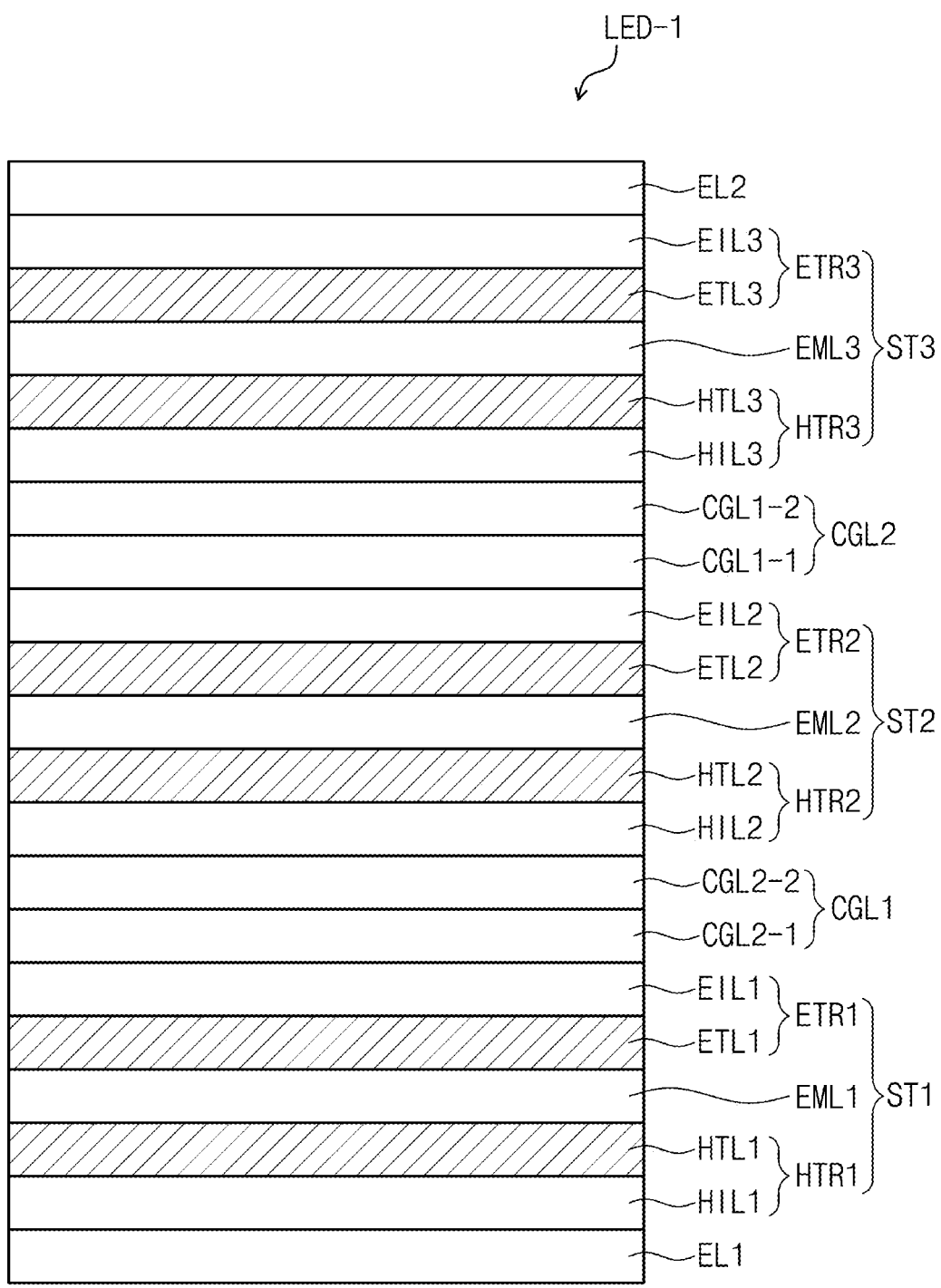
FIG. 3 is a cross-sectional view schematically showing a light emitting device according to an embodiment of the present disclosure.

FIG. 3 is a cross-sectional view schematically showing a light emitting device according to an embodiment of the present disclosure. Hereinafter, in describing the light emitting device of an embodiment with reference to FIG. 3, the same reference numerals are given to the components described above and duplicative descriptions thereof will not be provided.

Referring to FIG. 3, a light emitting device LED-1 according to an embodiment of the present disclosure may further include a third stack ST3 disposed on the first stack ST1 and the second stack ST2. Between the second stack ST2 and the third stack ST3, the second charge generation layer CGL2 may be disposed. The third stack ST3 may be disposed between the second charge generation layer CGL2 and the second electrode EL2.

The third stack ST3 may have a stacked structure similar to that of the first stack ST1 and the second stack ST2. For example, the third stack ST3 may be one in which a third hole transport region HTR3, a third light emitting layer EML3, and a third electron transport region ETR3 are sequentially stacked.

The third light emitting layer EML3 may include the light emitting material described above, without limitation. The third light emitting layer EML3 may generate blue light, and the blue light may be light having a wavelength of 410 nm to 480 nm. The light emission spectrum of the blue light may have a maximum peak within 440 nm to 460 nm.

The third hole transport region HTR3 may include a third hole injection layer HIL3 and a third hole transport layer HTL3. The third electron transport region ETR3 may include a third electron injection layer EIL3 and a third electron transport layer ETL3. The third hole transport region HTR3 may include the hole injection material and the hole transport material described above. The third electron transport region ETR3 may include the electron injection material and the electron transport material described above.

FIG. 3 illustrates the third hole transport region HTR3 including the third hole injection layer HIL3 and the third hole transport layer HTL3, but the embodiment of the present disclosure is not limited thereto. Any one of the third hole transport layer HTL3 and the third hole injection layer HIL3 may be omitted. In an embodiment, the third hole transport region HTR3 may include only the third hole injection layer HIL3, and the third hole injection layer HIL3 may be a layer adjacent to the third light emitting layer EML3.

FIG. 3 illustrates the third electron transport region ETR3 including the third electron injection layer EIL3 and the third electron transport layer ETL3, but the embodiment of the present disclosure is not limited thereto. Any one of the third electron injection layer EIL3 and the third electron transport layer ETL3 may be omitted. In an embodiment, the third electron transport region ETR3 may include only the third electron transport layer ETL3, and the third electron transport layer ETL3 may be a layer adjacent to the third light emitting layer EML3. The third electron transport layer ETL3 may be provided in a plurality.

In the light emitting device LED-1 according to an embodiment, a layer adjacent to the third light emitting layer EML3 may include a light emitting material. For example, from among the third hole transport region HTR3 and the third electron transport region ETR3, a layer adjacent to the third light emitting layer EML3 may include a light emitting material. In an embodiment, at least one of the third hole transport layer HTL3 or the third electron transport layer ETL3 adjacent to the third light emitting layer EML3 may include a light emitting material. In an embodiment, each of the third hole transport layer HTL3 and the third electron transport layer ETL3 may include a light emitting material. In an embodiment, all of the first hole transport layer HTL1, the first electron transport layer ETL1, the second hole transport layer HTL2, and the second electron transport layer ETL2, the third hole transport layer HTL3, and the third electron transport layer ETL3 may include a light emitting material. The light emitting material included in each of the third hole transport layer HTL3 and the third electron transport layer ETL3 may be the same material. The light emitting material included in each of the third hole transport layer HTL3 and the third electron transport layer ETL3 may be different from the light emitting material included in the third light emitting layer EML3.

Each of the third hole transport layer HTL3 and the third electron transport layer ETL3 may include a hole transport material or an electron transport material (respectively) as a base substance, and may be doped with a light emitting material. For example, each of the third hole transport layer HTL3 and the third electron transport layer ETL3 may include the hole transport material or the electron transport material (respectively) as the base substance, and may be doped with a phosphorescent light emitting dopant. The light emitting material included in each of the third hole transport layer HTL3 and the third electron transport layer ETL3 may be doped to less than 10% of the total mass of each layer. The light emitting material doped in each of the third hole transport layer HTL3 and the third electron transport layer ETL3 may be a material having a lowest triplet excitation energy level T1 lower than that of the hole transport material or the electron transport material that forms the base substance of the corresponding layer.

Between the second stack ST2 and the third stack ST3, the second charge generation layer CGL2 may be provided. When a voltage is applied, the second charge generation layer CGL2 may generate charges (electrons and holes) by forming a complex through an oxidation-reduction reaction. Then, the second charge generation layer CGL2 may provide the generated charges to each of adjacent stacks ST2 and ST3. The second charge generation layer CGL2 may double the efficiency of a current generated in one stack ST2 or ST3, and may serve to control the balance of charges between the second stack ST2 and the third stack ST3.

The second charge generation layer CGL2 may have a layered structure in which a first sub-charge generation layer CGL2-1 and a second sub-charge generation layer CGL2-2 are bonded to each other. As an example, the first sub-charge generation layer CGL2-1 may be an n-type charge generation layer, which provides electrons to the second stack ST2 by being disposed adjacent to the second stack ST2. The second sub-charge generation layer CGL2-2 may be a p-type charge generation layer, which provides holes to the third stack ST3 by being disposed adjacent to the third stack ST3. Between the first sub-charge generation layer CGL2-1 and the second sub-charge generation layer CGL2-2, a buffer layer may be further disposed.

Figure 4:
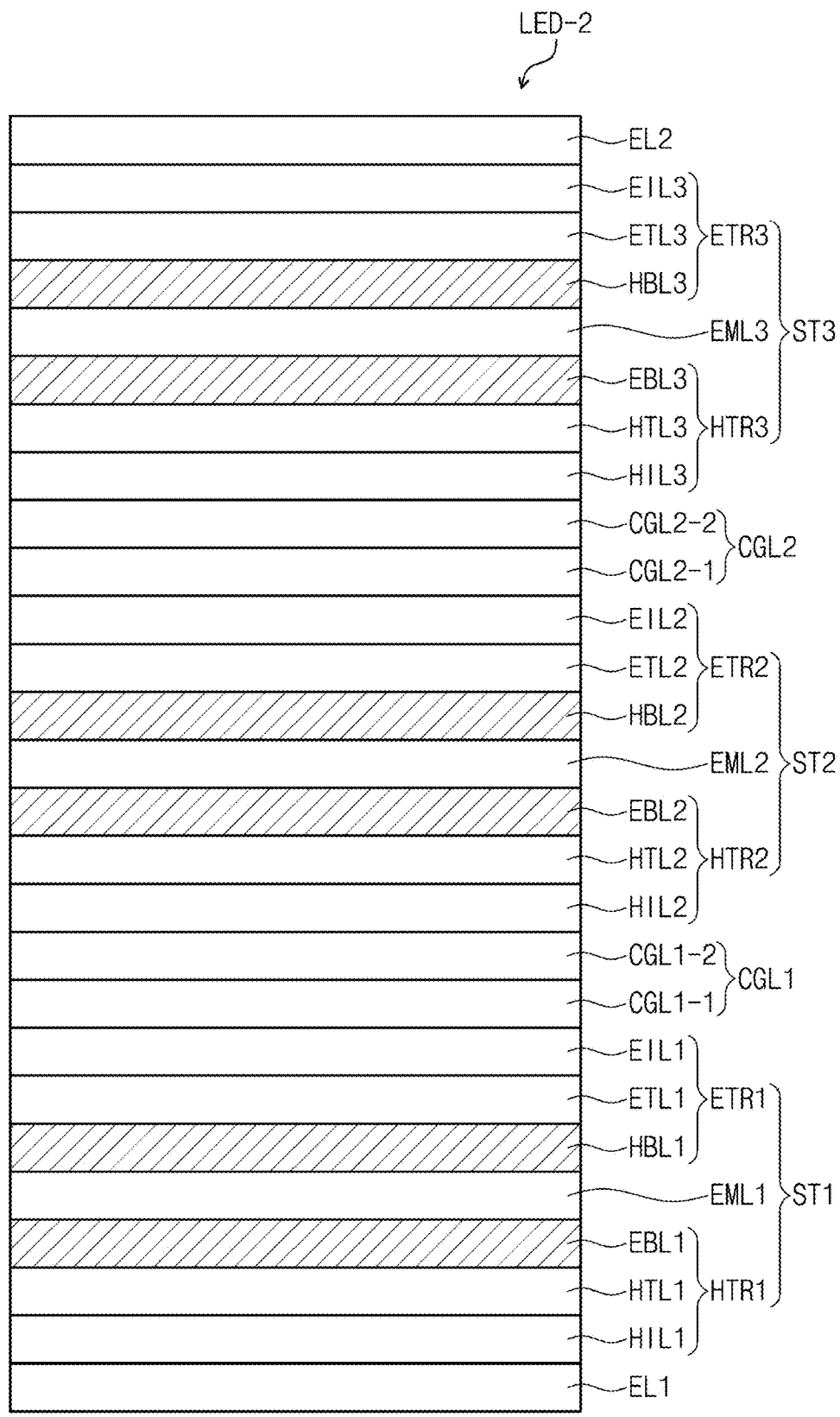
FIG. 4 is a cross-sectional view schematically showing a light emitting device according to an embodiment of the present disclosure.

FIG. 4 is a cross-sectional view schematically showing a light emitting device according to an embodiment of the present disclosure. Hereinafter, in describing the light emitting device of an embodiment with reference to FIG. 4, the same reference numerals are given to the components described above and duplicative descriptions thereof will not be provided.

Referring to FIG. 4, in a light emitting device LED-2 according to an embodiment, the first hole transport region HTR1 may further include a first electron blocking layer EBL1 disposed between the first light emitting layer EML1 and the first hole transport layer HTL1. The first electron transport region ETR1 may further include a first hole blocking layer HBL1 disposed between the first light emitting layer EML1 and the first electron transport layer ETL1. The second hole transport region HTR2 may further include a second electron blocking layer EBL2 disposed between the second light emitting layer EML2 and the second hole transport layer HTL2. The second electron transport region ETR2 may further include a second hole blocking layer HBL2 disposed between the second light emitting layer EML2 and the second electron transport layer ETL2. The third hole transport region HTR3 may further include a third electron blocking layer EBL3 disposed between the third light emitting layer EML3 and the third hole transport layer HTL3. The third electron transport region ETR3 may further include a third hole blocking layer HBL3 disposed between the third light emitting layer EML3 and the third electron transport layer ETL3.

An electron blocking layer is a layer which serves to prevent or reduce electrons from being leaked from an electron transport region to a hole transport region. The thickness of the electron blocking layer may be about 10 Å to about 1000 Å. The electron blocking layer may include, for example, a carbazole-based derivative (such as N-phenylcarbazole and/or polyvinylcarbazole), a fluorene-based derivative, a triphenylamine-based derivative (such as N,N'-bis(3-methylphenyl)-N,N'-diphenyl-[1,1-biphenyl]-4,4'-diamine (TPD) and/or 4,4',4"-tris(N-carbazolyl)triphenylamine (TCTA)), N,N'-di(naphthalene-1-yl)-N,N'-diphenylbenzidine (NPD), 4,4'-Cyclohexylidene bis[N,N-bis(4-methylphenyl)benzenamine] (TAPC), 4,4'-Bis[N, N'-(3-tolyl)amino]-3,3'-dimethylbiphenyl (HMTPD), mCP, and/or the like.

A hole blocking layer is a layer which serves to prevent or reduce holes from being leaked from the hole transport region to the electron transport region. The thickness of the hole blocking layer may be about 10 Å to about 1000 Å. The hole blocking layer may include, for example, at least one of 2,9-dimethyl-4,7-diphenyl-1,10-phenanthroline (BCP), 4,7-diphenyl-1,10-phenanthroline (Bphen), or 2,4,6-tri([1,1'-biphenyl]-3-yl)-1,3,5-triazine (T2T), but the embodiment of the present disclosure is not limited thereto.

In the light emitting device LED-2 according to an embodiment, layers adjacent to the first to third light emitting layers EML1, EML2, and EML3 are the first to third electron blocking layers EBL1, EBL2, and EBL3 and the first to third hole blocking layers HBL1, HBL2, and HBL3, and at least one of the first to third electron blocking layers EBL1, EBL2, and EBL3 or the first to third hole blocking layers HBL1, HBL2, and HBL3 may include a light emitting material. In an embodiment, each of the first to third electron blocking layers EBL1, EBL2, and EBL3 and the first to third hole blocking layers HBL1, HBL2, and HBL3 may include a light emitting material. The light emitting material included in each of the first to third electron blocking layers EBL1, EBL2, and EBL3 and the first to third hole blocking layers HBL1, HBL2, and HBL3 may be the same material. The light emitting material included in each of the first to third electron blocking layers EBL1, EBL2, and EBL3 and the first to third hole blocking layers HBL1, HBL2, and HBL3 may be different from the light emitting material included in the first to third light emitting layers EML1, EML2, and EML3.

Figure 5:
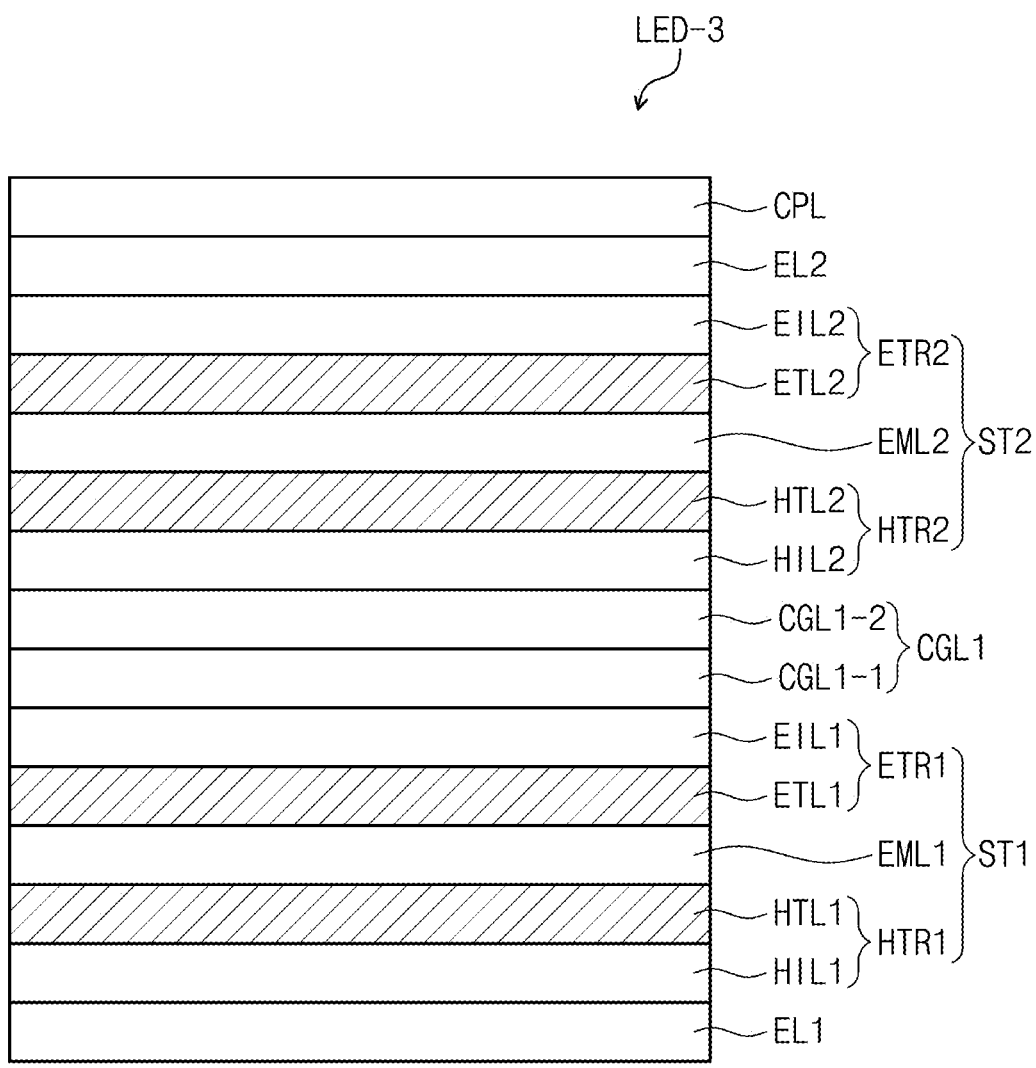
FIG. 5 is a cross-sectional view schematically showing a light emitting device according to an embodiment of the present disclosure.

FIG. 5 is a cross-sectional view schematically showing a light emitting device according to an embodiment of the present disclosure. Hereinafter, in describing the light emitting device of an embodiment with reference to FIG. 5, the same reference numerals are given to the components described above and duplicative descriptions thereof will not be provided.

A light emitting device LED-3 according to an embodiment may further include a capping layer CPL disposed on the second electrode EL2. The capping layer CPL may include, for example, α-NPD, NPB, TPD, m-MTDATA, Alq$_3$, CuPc, N4,N4,N4',N4'-tetra (biphenyl-4-yl) biphenyl-4,4'-diamine (TPD15), 4,4',4"-tris(N-carbazolyl)triphenylamine), N,N'-bis (naphthalen-1-yl(TCTA), and/or the like. The capping layer CPL serves to help the light emitted from the light emitting layers EML1 and EML2 of the light emitting device LED-3 to be efficiently (or suitably) emitted to the outside of the light emitting device LED-3. When the light emitting device LED-3 of an embodiment further includes a thin film encapsulation layer, the capping layer CPL may be disposed between the second electrode EL2 and the thin film encapsulation layer.

Figure 6A:
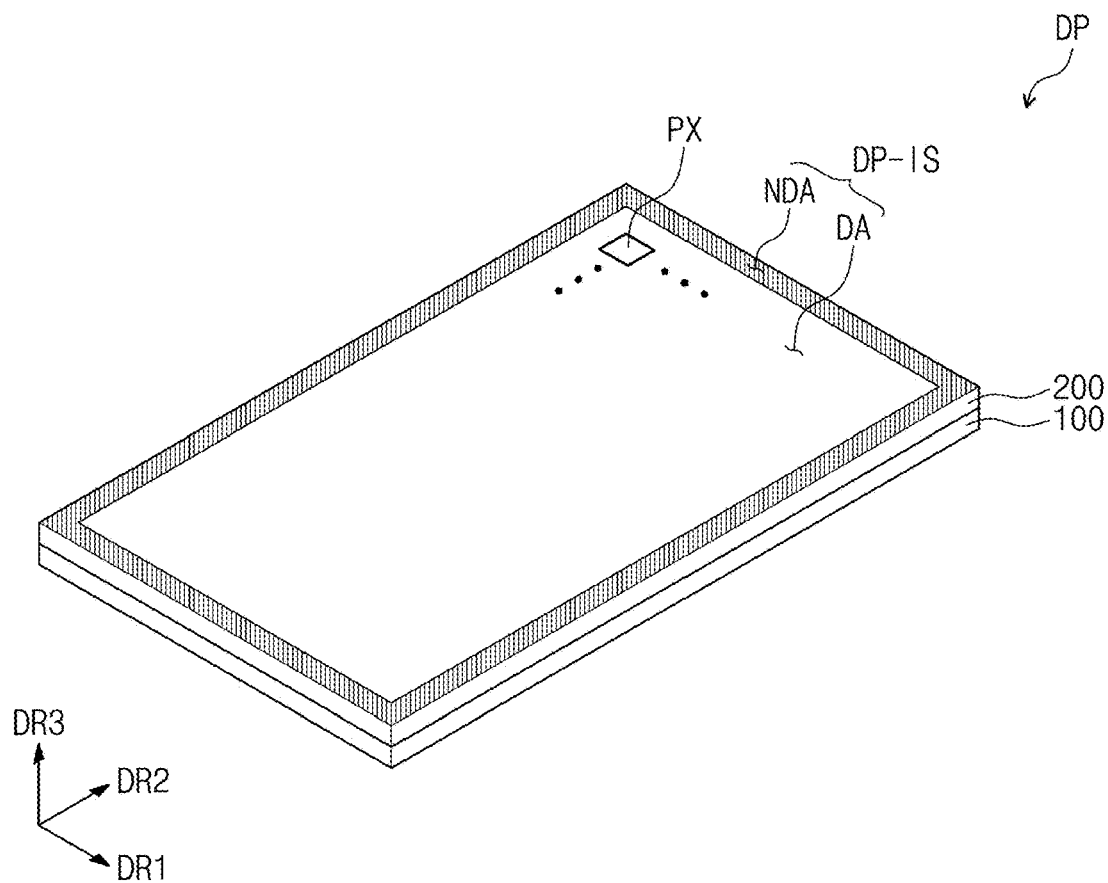
FIG. 6A is a perspective view of a display panel according to an embodiment of the present disclosure.
Figure 6B:
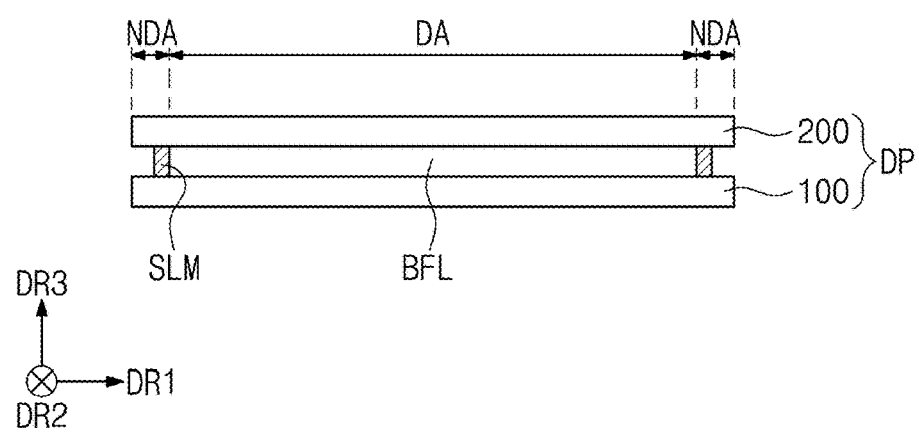
FIG. 6B is a cross-sectional view of a display panel according to an embodiment of the present disclosure.
Figure 7:
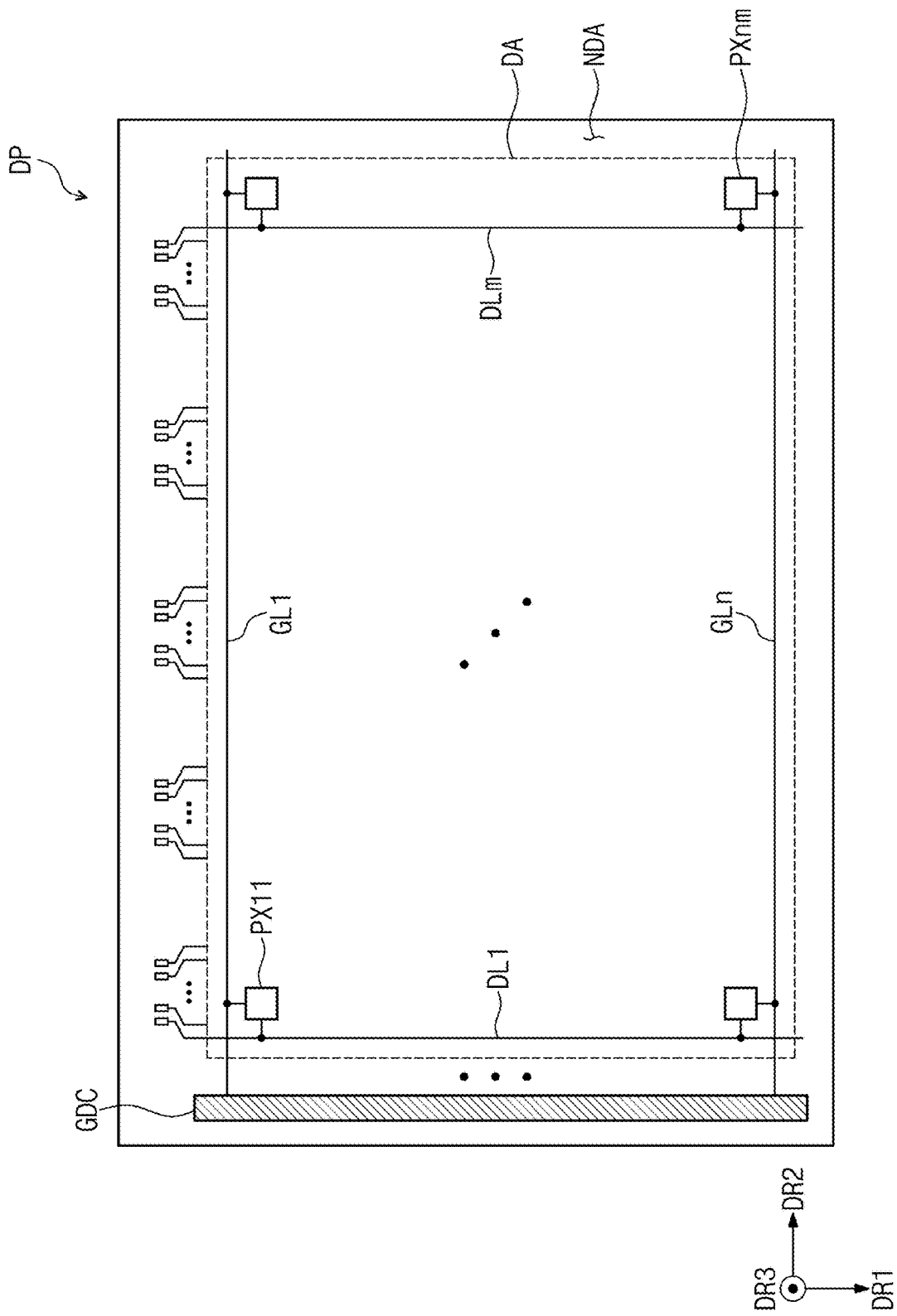
FIG. 7 is a plan view of a display panel according to an embodiment of the present disclosure.

FIG. 6A is a perspective view of a display panel according to an embodiment of the present disclosure. FIG. 6B is a cross-sectional view of a display panel according to an embodiment of the present disclosure. FIG. 7 is a plan view of a display panel according to an embodiment of the present disclosure.

Referring to FIG. 6A to FIG. 7, a display panel DP may be any one of a liquid crystal display panel, an electrophoretic display panel, a microelectromechanical system display panel (MEMS), an electrowetting display panel, an organic light emitting display panel, a micro LED display panel, a quantum dot display panel, and a quantum rod display panel, but the embodiment of the present disclosure is not particularly limited thereto.

The display panel DP may further include a chassis member and/or a molding member, and may further include a backlight unit, depending on the type (kind) of the display panel DP.

The display panel DP may include a lower display substrate 100 (or a first display substrate) and an upper display substrate 200 (or a second display substrate) facing the lower display substrate 100 and spaced apart therefrom. Between the lower display substrate 100 and the upper display substrate 200, a filling layer BFL may be filled. Also, in the display panel DP according to an embodiment, the filling layer BFL may be omitted, and between the lower display substrate 100 and the upper display substrate 200, a predetermined or set cell gap may be defined.

In the display panel DP according to an embodiment, a non-display region NDA may include a sealant SLM, which bonds the lower display substrate 100 and the upper display substrate 200. The sealant SLM may include an organic adhesive member and/or an inorganic adhesive member. For example, the sealant SLM may include frit.

As shown in FIG. 6A, the display panel DP may display an image through a display surface DP-IS. The display surface DP-IS is parallel to a plane defined by a first direction DR1 and a second direction DR2. The display surface DP-IS may include a display region DA and the non-display region NDA. In the display region DA, a pixel PX is disposed. The non-display region NDA is defined along the edge of the display surface DP-IS. The display region DA may be surrounded by the non-display region NDA.

The normal direction of (to) the display surface DP-IS, that is, the thickness direction of the display panel DP is indicated by a third direction DR3. A front surface (or an upper surface) and a back surface (or a lower surface) of each layer or unit described below are positioned along and are distinguished by the third direction DR3. However, the first to third directions DR1, DR2, and DR3 shown in the present embodiment are merely exemplary (example).

In an embodiment of the present disclosure, the display panel DP provided with a planar display surface DP-IS is illustrated, but the embodiment of the present disclosure is not limited thereto. The display panel DP may include a curved display surface and/or a three-dimensional display surface. The three-dimensional display surface may include a plurality of display regions indicating different directions.

FIG. 7 illustrates the planar arrangement relationship of signal lines GL1 to GLn and DL1 to DLm and pixels PX11 to PXnm. The signal lines GL1 to GLn and DL1 to DLm may include a plurality of gate lines GL1 to GLn and a plurality of data lines DL1 to DLm.

Each of the pixels PX11 to PXnm is connected to a corresponding gate line among the plurality of gate lines GL1 to GLn and a corresponding data line among the plurality of data lines DL1 to DLm. Each of the pixels PX11 to PXnm may include a pixel driving circuit and a light emitting device. Depending on the configuration of the pixel driving circuit, more types (or kinds) of signal lines may be provided in the display panel DP.

The pixels PX11 to PXnm may be disposed in a matrix form, but the embodiment of the present disclosure is not limited thereto. For example, the pixels PX11 to PXnm may be disposed in a pentile form. In some embodiments, the pixels PX11 to PXnm may be disposed in a diamond form.

A gate driving circuit GDC may be disposed in the non-display region NDA. The gate driving circuit GDC may be integrated into the display panel DP through an oxide silicon gate driver circuit (OSG) process and/or an amorphous silicon gate driver circuit (ASG) process.

Figure 8:
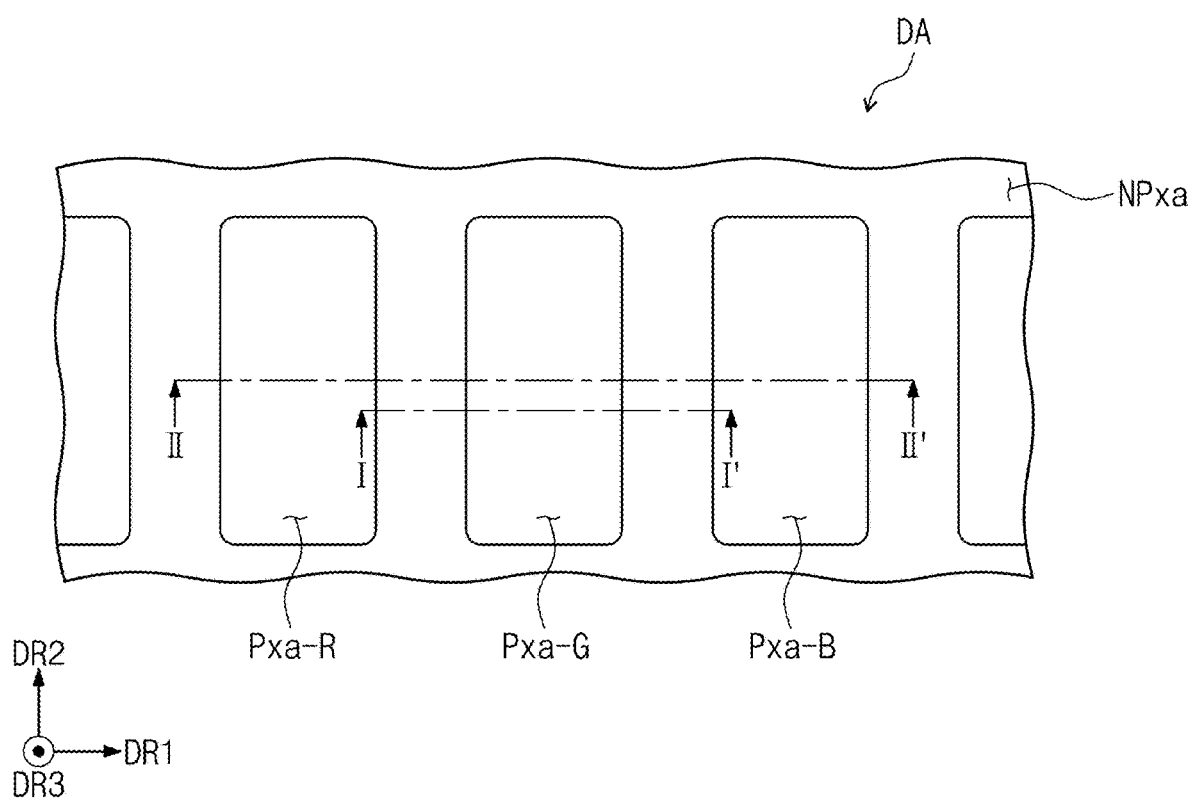
FIG. 8 is a plan view of pixel regions of a display panel according to an embodiment of the present disclosure.
Figure 9:
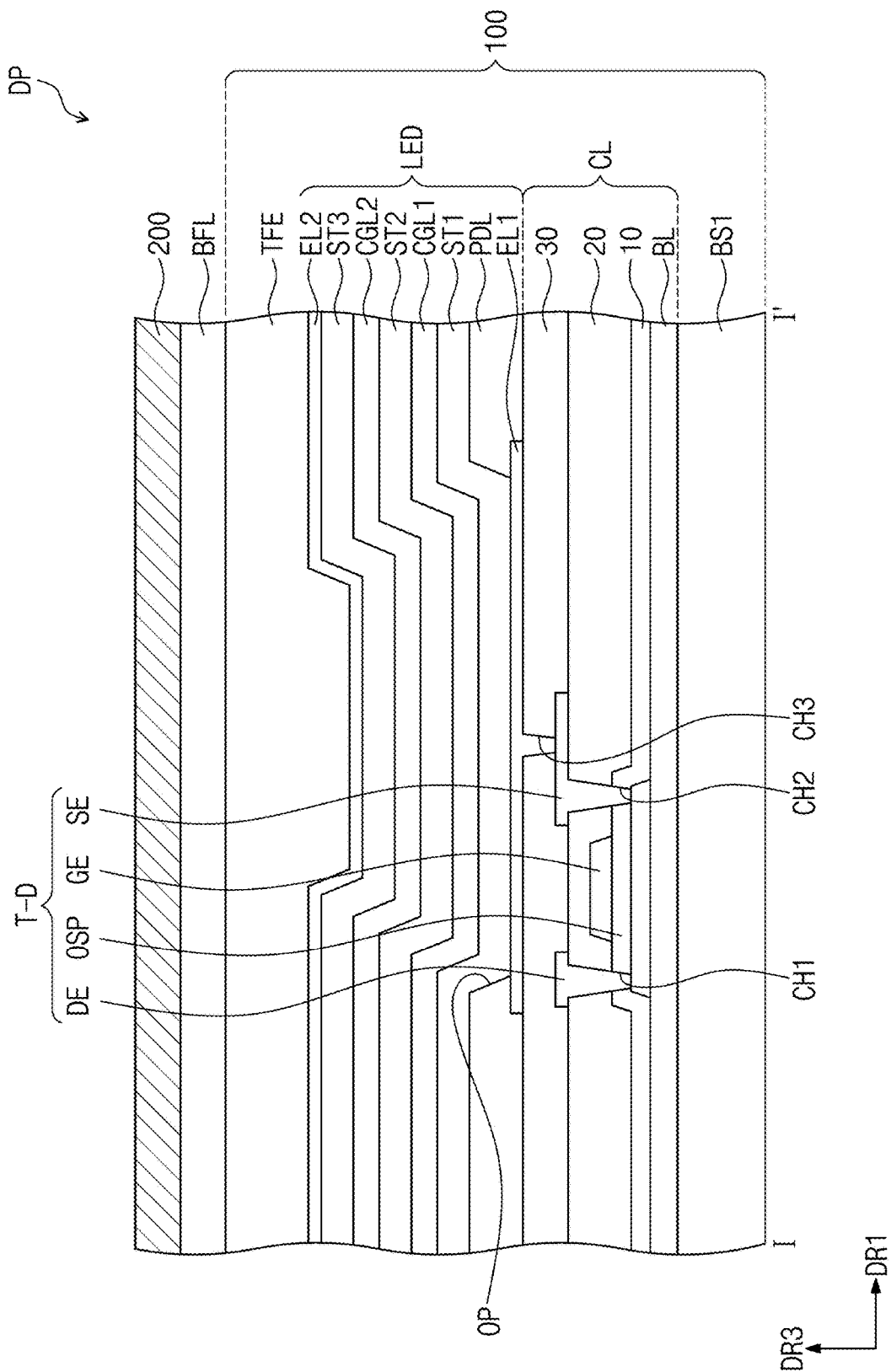
FIG. 9 is a cross-sectional view of one pixel region of a display panel according to an embodiment of the present disclosure.

FIG. 8 is a plan view of pixel regions of a display panel according to an embodiment of the present disclosure. FIG. 9 is a cross-sectional view of one pixel region of a display panel according to an embodiment of the present disclosure. FIG. 9 is a cross-sectional view corresponding to line I-I' of FIG. 8.

FIG. 8 is an enlarged view of a portion of the display region DA illustrated in FIG. 6A. FIG. 8 mainly illustrates three pixel regions Pxa-B, Pxa-G, and Pxa-R. The three pixel regions Pxa-B, Pxa-G, and Pxa-R illustrated in FIG. 8 may be repeatedly disposed throughout the display region DA.

FIG. 8 illustrates a stripe structure in which the pixel regions Pxa-B, Pxa-G, and Pxa-R are sequentially and alternatively disposed along the same line. However, the arrangement structure of the pixel regions Pxa-B, Pxa-G, and Pxa-R is not limited thereto, and there may be various arrangement forms. In an embodiment, the pixel regions Pxa-B, Pxa-G, and Pxa-R may have a diamond arrangement structure or a pentile-type arrangement structure.

Referring to FIG. 8, a peripheral region NPxa is disposed around first to third pixels regions Pxa-B, Pxa-G, and Pxa-R. The peripheral region NPxa sets the boundaries of the first to third pixels regions Pxa-B, Pxa-G, and Pxa-R to prevent (or reduce) color mixing between the first to third pixels regions Pxa-B, Pxa-G, and Pxa-R. In addition, the peripheral region NPxa blocks (or reduces) a source light, such that the source light is not provided to a user.

In the present embodiment, the first to third pixel regions Pxa-B, Pxa-G, and Pxa-R having the same planar area are illustrated, but the embodiment of the present disclosure is not limited thereto. The first to third pixel regions Pxa-B, Pxa-G, and Pxa-R may have different areas, or the area of at least two thereof may be different from each other. The first to third pixel regions Pxa-B, Pxa-G, and Pxa-R of a rectangular shape having a planar rounded corner region are illustrated, but the embodiment of the present disclosure is not limited thereto. When viewed on a plane (e.g., in a plan view), the first to third pixel regions Pxa-B, Pxa-G, and Pxa-R may have another polygonal shape, and/or may have a regular polygonal shape having a rounded corner region.

One of the first to third pixel regions Pxa-B, Pxa-G, and Pxa-R may provide a first light to the user, another thereof may provide a second light different from the first light, and the other thereof may provide a third light different from the first light and the second light. In an embodiment, the first pixel region Pxa-B may provide blue light, the second pixel region Pxa-G may provide green light, and the third pixel region Pxa-R may provide red light. In the present embodiment, the source light may be a blue light which is the first light. The source light may be generated from the same light source as that of the backlight unit, or may be generated from a display device such as a light emitting device.

FIG. 9 illustrates a cross-section of the display panel DP corresponding to the second pixel region Pxa-G. FIG. 9 illustrates a cross-section corresponding to a driving transistor and the light emitting device LED. In FIG. 9, the upper display substrate 200 is simply (schematically) illustrated.

As illustrated in FIG. 9, the display panel DP may include a first base substrate BS1, a circuit element layer CL disposed on the first base substrate BS1, and a display device layer LED disposed on the circuit element layer CL.

The first base substrate BS1 may include a synthetic resin substrate and/or a glass substrate. The circuit element layer CL includes at least one insulation layer and one circuit element. The circuit element includes a signal line and a driving circuit of a pixel, and/or the like. The circuit element layer CL may be formed through a forming process of an insulation layer, a semiconductor layer, and/or a conductive layer by coating, deposition, and/or the like, and/or a patterning process of the insulation layer, the semiconductor layer, and/or the conductive layer by a photolithography process.

In the present embodiment, the circuit element layer CL may include a buffer film BL, a first insulation layer 10, a second insulation layer 20, and a third insulation layer 30. The first insulation layer 10 and the second insulation layer 20 may each be an inorganic film and the third insulation layer 30 may be an organic film. The third insulation layer 30 may include polyimide (PI).

FIG. 9 illustrates the arrangement relationship of a semiconductor pattern OSP, a control electrode GE, an input electrode DE, and an output electrode SE constituting the driving transistor. First, second, and third through-holes CH1, CH2, and CH3 are also illustrated.

The display device layer LED includes a plurality of light emitting devices. To the light emitting device according to an embodiment included in the display device layer LED, the description of the light emitting device according to an embodiment provided with reference to FIG. 1 to FIG. 5 may be applied. The light emitting device may generate the source light described above. The source light generated by the light emitting device may be blue light. The light emitting device includes a first electrode, a second electrode, and a light emitting layer disposed therebetween. In the present embodiment, the light emitting device may include an organic light emitting device. However, the embodiment of the present disclosure is not limited thereto. The light emitting device included in the display device layer LED may be a light emitting device and/or the like including various suitable display devices such as an LCD, an LED, a micro-LED, a nano-LED, a quantum dot, and/or a quantum rod, which are non-limiting examples thereof.

The display device layer LED includes a pixel definition film PDL. The pixel definition film PDL has an opening OP corresponding to the second pixel region Pxa-G. The pixel definition film PDL may have a plurality of openings corresponding to the first to third pixel regions Pxa-B, Pxa-G, and Pxa-R, respectively.

The pixel definition film PDL may include a material which blocks (or reduces) light. In an embodiment, the pixel definition film PDL may include a black material. The pixel definition film PDL may include a black organic dye/pigment such as carbon black and/or aniline black. The pixel definition film PDL may further include a liquid-repellent organic matter.

In the display panel DP according to an embodiment, the first electrode EL1 may be disposed on the third insulation layer 30. The first electrode EL1 may be connected to the output electrode SE through the third through-hole CH3 passing through the third insulation layer 30. FIG. 9 illustrates the first electrode EL1 being disposed on the third insulation layer 30, but the embodiment of the present disclosure is not limited thereto. The first electrode EL1 may be embedded inside the third insulation layer 30 and be disposed to expose an upper surface thereof. In this case, the upper surface of the first electrode EL1 and the upper surface of the third insulation layer 30 may constitute the same plane.

The opening OP of the pixel definition film PDL exposes at least a portion of the first electrode EL1. On a plane, the pixel definition film PDL may overlap at least a portion of the first electrode EL1. For example, the pixel definition film PDL may overlap an outer portion of the first electrode EL1 on a plane.

On the first electrode EL1, the first stack ST1, the first charge generation layer CGL1, the second stack ST2, the second charge generation layer CGL2, the third stack ST3, and the second electrode EL2 may be sequentially disposed. The first stack ST1, the first charge generation layer CGL1, the second stack ST2, the second charge generation layer CGL2, the third stack ST3, and the second electrode EL2 may be commonly disposed on the first electrode EU and the pixel definition film PDL. The first stack ST1, the first charge generation layer CGL1, the second stack ST2, the second charge generation layer CGL2, the third stack ST3, and the second electrode EL2 may be commonly disposed over the first to third pixel regions Pxa-B, Pxa-G, and Pxa-R. However, the embodiment of the present disclosure is not limited thereto. The first stack ST1, the first charge genera-tion layer CGL1, the second stack ST2, the second charge generation layer CGL2, the third stack ST3, and the second electrode EL2 may be patterned and disposed only in the opening OP of the pixel definition film PDL. As a detailed description related to the first electrode EL1, the first stack ST1, the first charge generation layer CGL1, the second stack ST2, the second charge generation layer CGL2, the third stack ST3, and the second electrode EL2, the description of the light emitting device according to an embodiment provided with reference to FIG. 1 to FIG. 5 may be applied. Although FIG. 9 illustrates the display panel DP including a light emitting device having three stacks, the embodiment of the present disclosure is not limited thereto. The display panel DP may include a light emitting device of a single stack not having a tandem structure, or may include a light emitting device including two stacks.

In some embodiments, the second electrode EL2 may be connected to an auxiliary electrode. When the second electrode EL2 is connected to the auxiliary electrode, the resistance of the second electrode EL2 may be reduced.

An encapsulation member TFE may be disposed on the display device layer LED and may encapsulate the light emitting device. The encapsulation member TFE may include an inorganic film disposed on the outermost periphery thereof. The encapsulation member TFE may further include an organic film, and/or may have a structure in which the inorganic film and the organic film are alternately repeated. The encapsulation member TFE protects the light emitting device from moisture/oxygen, and may serve to protect the light emitting device from foreign substances.

In an embodiment, the inorganic film may include any suitable material without any particular limitation, as long as it is a material capable of protecting the light emitting device on a lower portion, and may include, for example, silicon nitride ($SiN_x$), silicon oxynitride ($SiO_yN_x$), silicon oxide ($SiO_y$), titanium oxide ($TiO_y$), aluminum oxide ($AlO_y$), and/or the like.

The organic film may include any suitable material without any particular limitation as long as it is a material capable of planarizing an upper portion of the light emitting device, and may include, for example, an acrylate-based organic matter (material). The inorganic film may be formed by a deposition method and/or the like, and the organic film may be formed by a deposition method, a coating method, and/or the like.

On the encapsulation member TFE, the filling layer BFL may be disposed. The filling layer BFL is disposed between the lower display substrate 100 and the upper display substrate 200 to prevent (or protect) a component such as a light control layer included in the upper substrate display substrate 200 from being in contact with the encapsulation member TFE of the lower display substrate 100, and may improve the light extraction efficiency of the display panel DP. The filling layer BFL may cover an upper surface of the encapsulation member TFE.

FIG. 9 illustrates the filling layer BFL being filled between the lower display substrate 100 and the upper display substrate 200, but the embodiment of the present disclosure is not limited thereto. In the display panel DP according to an embodiment of the present disclosure, the filling layer BFL may be omitted. In this case, between the lower display substrate 100 and the upper display substrate 200, a predetermined (or set) cell gap may be defined.

Figure 10:
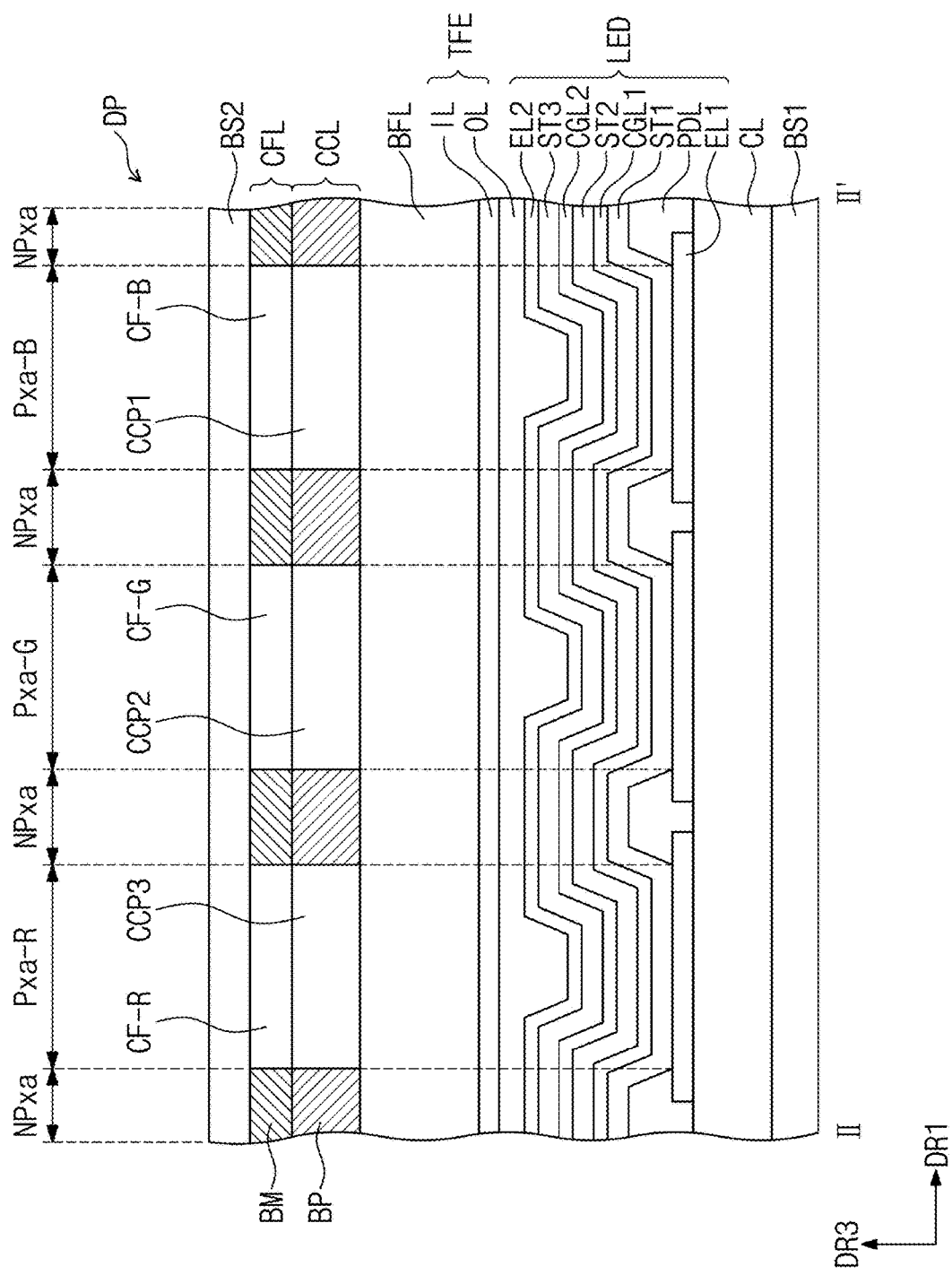
FIG. 10 is a cross-sectional view of a display panel according to an embodiment of the present disclosure.

FIG. 10 is a cross-sectional view of a display panel according to an embodiment of the present disclosure. FIG. 10 is a cross-sectional view corresponding to line II-II' of FIG. 8.

Referring to FIG. 10, the display panel DP of an embodiment includes the circuit element layer CL disposed on the first base substrate BS1, the display device layer LED disposed on the circuit element layer CL, the encapsulation member TFE disposed on the display device layer LED, and the filling layer BFL disposed on the encapsulation member TFE. The upper substrate 200 (see FIG. 9) of the display panel DP may include a second base substrate BS2, a color filter layer CFL disposed below the second base substrate BS2, and a light control layer CCL disposed below the color filter layer CFL.

In an embodiment, the display panel DP may include a first light emitting device overlapping the first pixel region Pxa-B, a second light emitting device overlapping the second pixel region Pxa-G, and a third light emitting device overlapping the third pixel region Pxa-R. To each light emitting device, the description of the light emitting device according to an embodiment provided with reference to FIG. 1 to FIG. 5 may be applied.

The encapsulation member TFE may be disposed on the light emitting device and may encapsulate the light emitting device. The encapsulation member TFE may include an inorganic film IL disposed on the outermost periphery thereof. The encapsulation member TFE may further include an organic film OL, or may have a structure in which the inorganic film IL and the organic film OL are alternately repeated. The encapsulation member TFE protects the light emitting device LED from moisture/oxygen, and may serve to protect the light emitting device LED from foreign substances such as dust particles.

In an embodiment, the inorganic film IL may include any suitable material without any particular limitation, as long as it is a material capable of protecting the light emitting device LED on a lower portion, and may include, for example, silicon nitride ($SiN_x$), silicon oxynitride ($SiO_yN_x$), silicon oxide ($SiO_y$), titanium oxide ($TiO_y$), aluminum oxide ($AlO_y$), and/or the like.

The organic film OL may include an acrylate-based organic matter (material), but the embodiment of the present disclosure is not particularly limited thereto. The inorganic film IL may be formed by a deposition method and/or the like, and the organic film OL may be formed by a deposition method, a coating method, and/or the like.

The display panel DP according to an embodiment may include the light control layer CCL. The light control layer CCL may be disposed on the display device layer LED. The light control layer CCL may be disposed on a plurality of light emitting devices, and may be spaced apart from the encapsulation member TFE by the filling layer BFL disposed therebetween.

The light control layer CCL may include a first light control unit CCP1, which transmits the first light, a second light control unit CCP2, which converts the first light into the second light, and a third light control unit CCP3, which converts the first light into the third light. For example, the second light may be green light, and the green light may be light corresponding to light of a wavelength region of 500 nm to 570 nm. The third light may be red light, and may be light corresponding to light of a wavelength region of 625 nm to 675 nm.

The second light control unit CCP2 and the third light control unit CCP3 may each independently include a light emitting body. The light emitting body may be a particle, which can change the wavelength of light. In an embodiment, the light emitting body included in the second light control unit CCP2 and the third light control unit CCP3 may each be a quantum dot.

Quantum dots are materials having a crystal structure of several nanometers in size, and are composed of hundreds to thousands of atoms. Due to the small size thereof, quantum dots exhibit a quantum confinement effect, in which an energy band gap is increased. When light of a wavelength having higher energy than the band gap is incident on the quantum dots, the quantum dots are excited by absorbing the light and fall to a ground state by emitting light of a specific wavelength. The emitted light of a specific wavelength has a value corresponding to the band gap. When the size and composition of the quantum dots are controlled, light emitting properties caused by the quantum confinement effect may be controlled.

A core of a quantum dot may be selected from a Group II-VI compound, a Group III-V compound, a Group IV-VI compound, a Group IV element, a Group IV compound, and combinations thereof.

The Group II-VI compound may be selected from a binary compound (selected from CdSe, CdTe, Cds, ZnS, ZnSe, ZnTe, ZnO, HgS, HgSe, HgTe, MgSe, MgS, and a mixture thereof), a ternary compound (selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof), and a quaternary compound (selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof).

The Group III-V compound may be selected from a binary compound (selected from GaN, GaP, GaAs, GaSb, AlN, AlP, AlAs, AlSb, InN, InP, InAs, InSb, and a mixture thereof), a ternary compound (selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof), and a quaternary compound (selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof).

The Group IV-VI compound may be selected from a binary compound (selected from SnS, SnSe, SnTe, PbS, PbSe, PbTe, and a mixture thereof), a ternary compound (selected from SnSeS, SnSeTe, SnSTe, PbSeS, PbSeTe, PbSTe, SnPbS, SnPbSe, SnPbTe, and a mixture thereof), and a quaternary compound (selected from SnPbSSe, SnPbSeTe, SnPbSTe, and a mixture thereof). The Group IV element may be selected from Si, Ge, and a mixture thereof. The Group IV compound may be a binary compound selected from SiC, SiGe, and a mixture thereof.

In some embodiments, a binary compound, a ternary compound, and/or a quaternary compound may be present in a particle with a uniform concentration distribution, or may be present in the same particle with a partially different concentration. In some embodiments, quantum dots may have a core/shell structure, in which one quantum dot surrounds another quantum dot. An interface between a core and a shell may have a concentration gradient in which the concentration of an element present in the shell becomes lower toward the center.

In some embodiments, a quantum dot may have a core-shell structure including a core having nano-crystals described above and a shell surrounding the core. The shell of the quantum dot having a core-shell structure may serve as a protection layer for preventing (or reducing) the chemical deformation of the core so as to maintain semiconductor properties, and/or as a charging layer for imparting electrophoresis properties to the quantum dot. The shell may be a monolayer or a multi-layer. An interface between the core and the shell may have a concentration gradient in which the concentration of an element present in the shell becomes lower toward the center. Non-limiting examples of the shell of the quantum dot having a core-shell structure may include a metal oxide, a non-metal oxide, a semiconductor compound, and a combination thereof.

For example, the metal oxide or the non-metal oxide may be a binary compound (such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$), and/or a ternary compound (such as $MgAl_2O_4$, $CoFe_2O_4$, $NiFe_2O_4$, and/or $CoMn_2O_4$). However, the embodiment of the present disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like. However, the embodiment of the present disclosure is not limited thereto.

A quantum dot may have a full width of half maximum (FWHM) of a light emission wavelength spectrum of about 45 nm or less, for example, about 40 nm or less, or about 30 nm or less, and color purity or color reproducibility may be improved in the above range. Light emitted through such quantum dot may be emitted in all directions so that a light viewing angle may be improved.

Although the form of a quantum dot is not particularly limited as long as it is a suitable form for the intended purpose, a quantum dot in the form of, for example, spherical, pyramidal, multi-arm, and/or cubic nanoparticles, nanotubes, nanowires, nanofibers, nanoparticles, and/or the like may be used.

A quantum dot may control the color of emitted light according to the particle size thereof. Accordingly, the quantum dot may have various light emission colors such as blue, red, green, and/or the like. The smaller the particle size of a quantum dot, the shorter the wavelength region of light may be emitted. For example, the particle size of a quantum dot emitting green light may be smaller than the particle size of a quantum dot emitting red light. For example, the particle size of a quantum dot emitting blue light may be smaller than the particle size of a quantum dot emitting green light.

For example, the particle size of a quantum dot included in the second light control unit CCP2 may be smaller than the particle size of a quantum dot included in the third light control unit CCP3. Here, the quantum dot included in the second light control unit CCP2 may emit light of a shorter wavelength than that of the quantum dot included in the third light control unit CCP3.

In an embodiment, the light control layer CCL may include a base resin. The light control layer CCL may further include a scattering particle. The light emitting body and the scattering particle may be included in only a portion of the light control layer CCL. In an embodiment, the first light control unit CCP1 may include only the scattering particle, and not the light emitting body. The second light control unit CCP2 and the third light control unit CCP3 may each independently include both the light emitting body and the scattering particle.

The base resin is a medium in which light emitting bodies are dispersed, and may be formed of one or more suitable resin compositions, which may be commonly referred to as a binder. However, the embodiment of the present disclosure is not limited thereto. In the present specification, any medium may be referred to as a base resin regardless of the name, additional functions, composition materials, and/or the like thereof, as long as the medium can disperse and dispose light emitting bodies. The base resin may be a polymer resin. For example, the base resin may be an acrylic resin, a urethane-based resin, a silicone-based resin, an epoxy resin, and/or the like. The base resin may be a transparent resin.

The scattering particle may be $TiO_2$ and/or a silica-based nano-particle. The scattering particle may scatter light. In another embodiment of the present disclosure, the scattering particle may be omitted.

The light control layer CCL may include a plurality of the light control units CCP1, CCP2, and CCP3. In an embodiment, each of the first light control unit CCP1, the second light control unit CCP2 and the third light control unit CCP3 may be disposed spaced apart from each other on a plane. Each of the first light control unit CCP1, the second light control unit CCP2 and the third light control unit CCP3 may be arranged spaced apart from each other on a plane defined by the axis of the first direction DR1 and the axis of the third direction DR3.

The first light control unit CCP1 may be disposed corresponding to the first pixel region Pxa-B, the second light control unit CCP2 may be disposed corresponding to the second pixel region Pxa-G, and the third light control unit CCP3 may be disposed corresponding to the third pixel region Pxa-R.

In FIG. 10, the first light control unit CCP1, the second light control unit CCP2 and the third light control unit CCP3 are illustrated as having substantially the same area and/or the same thickness. However, the embodiment of the present disclosure is not limited thereto. The first light control unit CCP1, the second light control unit CCP2 and the third light control unit CCP3 may have different areas and/or different thicknesses. For example, the third light control unit CCP3 may have a larger area than those of the first light control unit CCP1 and the second light control unit CCP2. The first light control unit CCP1 may have a smaller area than those of the second light control unit CCP2 and the third light control unit CCP3.

Between the first light control unit CCP1 and the second light control unit CCP2 spaced apart from each other, and between the second light control unit CCP2 and the third light control unit CCP3, a partition wall portion BP may be disposed. The partition wall portion BP overlaps the peripheral region NPxa on a plane. The partition wall portion BP may prevent (or reduce) a light leakage phenomenon and may distinguish the boundaries between adjacent light control units CCP1, CCP2, and CCP3. The partition wall portion BP may include an organic light blocking material containing a black pigment and/or a black dye. The partition wall portion BP may include an organic material having hydrophobicity. In an embodiment, the partition wall portion BP may be omitted.

In an embodiment, the display panel DP may include the color filter layer CFL. The color filter layer CFL is disposed on the light control layer CCL, and may include first to third color filter units CF-B, CF-G, and CF-R, and a light blocking member BM.

In an embodiment, the first to third color filter units CF-B, CF-G, and CF-R may be disposed spaced apart from each other on a plane. Referring to FIG. 10, the first to third color filter units CF-B, CF-G, and CF-R may be arranged spaced apart from each other along the first direction DR1.

The first to third color filter units CF-B, CF-G, and CF-R may transmit light having different wavelengths. The first color filter unit CF-B may be disposed corresponding to the first light control unit CCP1 and may transmit the first light. The second color filter unit CF-G may be disposed corresponding to the second light control unit CCP2 and may block (or reduce) the first light and transmit the second light. The third color filter unit CF-R may be disposed corresponding to the third light control unit CCP3 and may block (or reduce) the first light and transmit the third light. By including the color filter layer CFL in the display panel DP, external light reflection may be effectively reduced, and color mixing may be prevented (or reduced).

The light blocking member BM is provided corresponding to the peripheral region NPxa. The light blocking member BM may be formed by including an organic light blocking material and/or an inorganic light blocking material, both including a black pigment and/or a black dye. The light blocking member BM may prevent (or reduce) a light leakage phenomenon and may distinguish the boundaries between adjacent color filter units. At least a portion of the light blocking member BM may be disposed to overlap a neighboring color filter unit. For example, on a plane defined by the axis of the first direction DR1 and the axis of the third direction DR3, the light blocking member BM may be disposed such that at least a portion thereof overlaps neighboring color filter units in a thickness direction (third direction DR3). In FIG. 10, the light blocking member BM is illustrated as overlapping color filter units entirely in the thickness direction so that the thickness of the light blocking member BM is the same as the thickness of the entire color filter layer CFL. However, the embodiment of the present disclosure is not limited thereto. The thickness of the light blocking member BM may be less than the thickness of the entire color filter layer CFL. In an embodiment of the present disclosure, the light blocking member BM is shown as being included in the color filter layer CFL. However, the embodiment of the present disclosure is not limited thereto. The light blocking member BM may be omitted.

In an embodiment, the filling layer BFL may fill a space between the encapsulation member TFE and the light control layer CCL. Filling a space between the encapsulation member TFE and the light control layer CCL may mean that a space between the encapsulation member TFE and the light control layer CCL is filled with the filling layer BFL such that there is no internal space between the encapsulation member TFE and the light control layer CCL, and that the filling layer BFL covers the partition wall portion BP entirely and contacts a portion of each of an upper surface of the encapsulation member TFE and a lower surface of the light control layer CCL.

The filling layer BFL may prevent (or reduce) the light emitting body, the scattering particle, and/or the like included in the light control layer CCL from being oxidized by internal air, and accordingly, the light extraction efficiency of the display panel DP may be maintained without being greatly (substantially) changed.

In an embodiment, the filling layer BFL may be disposed directly on the inorganic film IL disposed on the outermost periphery of the encapsulation member TFE. The filling layer BFL may include an inorganic binder, an organic binder, and/or a liquid crystal compound, but the embodiment of the present disclosure is not particularly limited thereto.

A display panel according to an embodiment of the present disclosure includes a light emitting device in which a plurality of stacks are stacked, wherein the light emitting device according to an embodiment of the present disclosure may include a light emitting material in an organic layer adjacent to a light emitting layer. For example, the light emitting device according to an embodiment may include the light emitting material in the light emitting layer, and also may include a different light emitting material in the organic layer formed to be in contact with the light emitting layer. Accordingly, the light emitting efficiency of the light emitting device may be improved, and the wavelength of light emitted by the light emitting device may be reduced. For example, the light emitting layer of the light emitting device may emit blue light, and because the organic layer formed to be in contact with the light emitting layer includes a different light emitting material, the light generated by the light emitting device may be light of a bluer color. Accordingly, the light conversion efficiency of a light emitting body such as a quantum dot included in a light control layer of the display panel may be increased, and the overall light emitting efficiency of the display panel may be increased.

Hereinafter, the present disclosure will be described in more detail with reference to Examples and Comparative Examples. The following examples are for illustrative purposes only, to facilitate the understanding of the present disclosure, and thus, the scope of the present disclosure is not limited thereto.

Stacking Structure of Device

A first electrode, a first stack, a first charge generation layer, a second stack, a second charge generation layer, a third stack, a second electrode, and a capping layer were sequentially stacked to produce a light emitting device according to an embodiment. The first electrode was formed to a thickness of 260 Å. The first stack was produced to have a structure in which a hole injection layer of 50 Å, a hole transport layer of 200 Å, an electron blocking layer of 50 Å, a light emitting layer of 200 Å, a hole blocking layer of 50 Å, and an electron transport layer of 250 Å are sequentially stacked. The first charge generation layer was produced to have a structure in which an n-charge generation layer of 150 Å and a p-charge generation layer of 50 Å are sequentially stacked. The second stack was produced to have a structure in which a hole transport layer of 200 Å, an electron blocking layer of 50 Å, a light emitting layer of 200 Å, a hole blocking layer of 50 Å, and an electron transport layer of 250 Å are sequentially stacked. The second charge generation layer was produced to have a structure in which an n-charge generation layer of 150 Å and a p-charge generation layer of 50 Å are sequentially stacked. The third stack was produced to have a structure in which a hole transport layer of 200 Å, an electron blocking layer of 50 Å, a light emitting layer of 200 Å, a hole blocking layer of 50 Å, an electron transport layer of 250 Å, and an electron injection layer of 10 Å are sequentially stacked. The second electrode was formed to a thickness of 100 Å. The capping layer was formed to a thickness of 600 Å. Materials used for forming each layer are as follows.

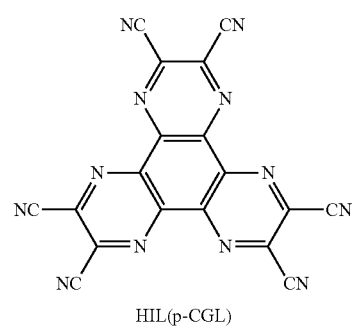

HIL(p-CGL)

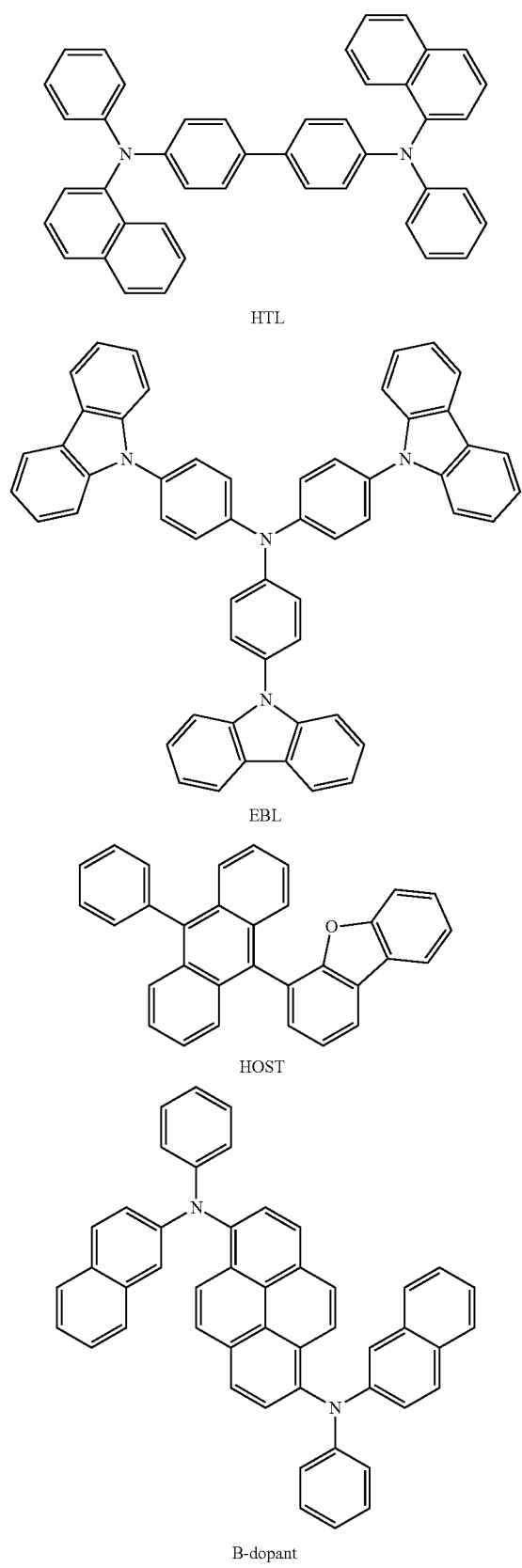
HTL
EBL
HOST
B-dopant
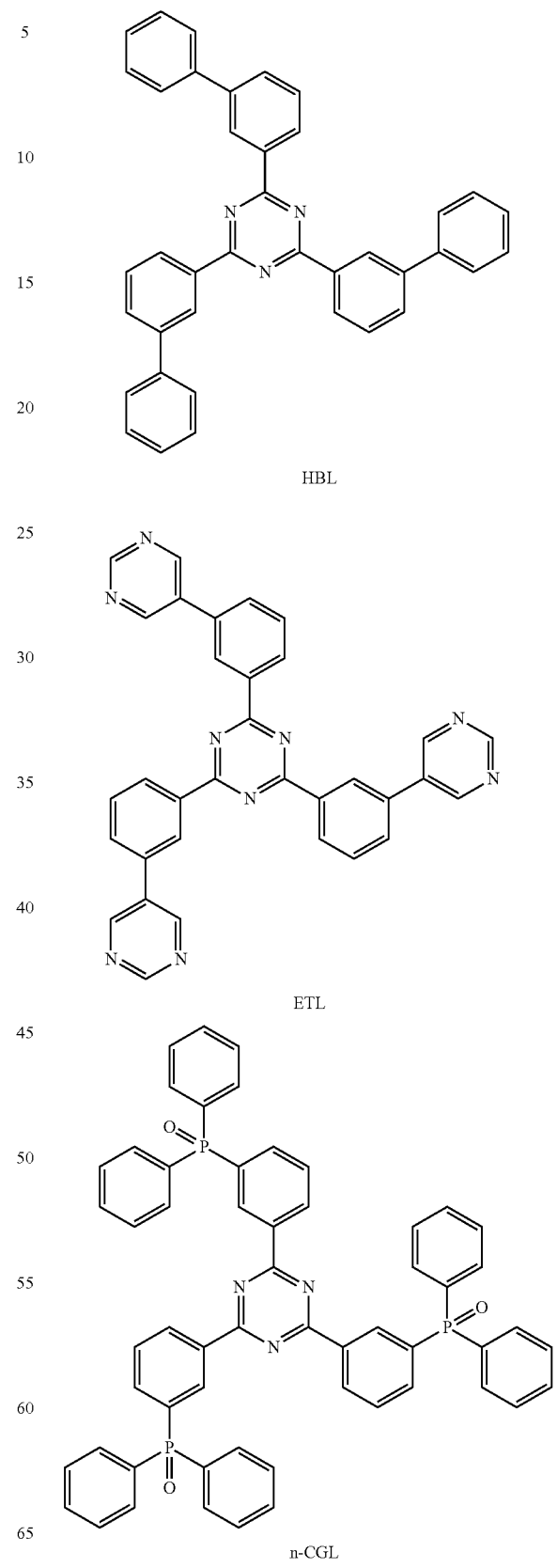
HBL
ETL
n-CGL

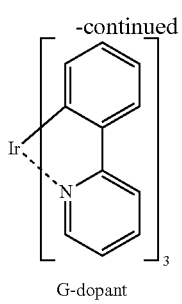

G-dopant

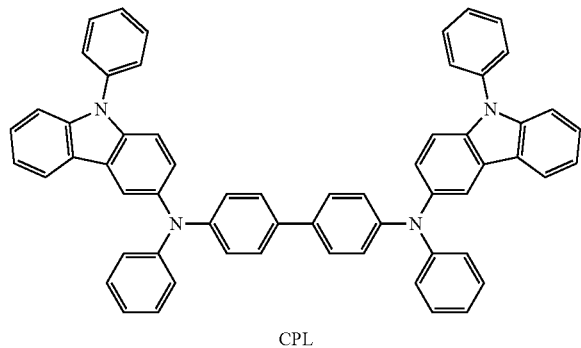

CPL

The first electrode was formed by stacking ITO/Ag/ITO to a thickness of 80 Å/1000 Å/80 Å, respectively. The hole injection layer and the p-charge generation layer were each formed through (of) dipyrazino[2,3-f:2',3'-h]quinoxaline-2,3,6,7,10,11-hexacarbonitrile (HAT-CN). The hole transport layer was formed through (of) N,N'-di(naphthalene-1-yl)-N,N'-diphenyl-benzidine (NPB). The electron blocking layer was formed through (of) 4,4',4"-tris(N-carbazolyl)triphenylamine (TCTA). The light emitting layer was formed by doping 4-(10-phenylanthracen-9-yl)dibenzo[b,d]furan with a blue dopant (N1,N6-di(naphthalen-2-yl)-N1,N6-diphenylpyrene-1,6-diamine) by 3%. The hole blocking layer was formed through (of) 2,4,6-tri([1,1'-biphenyl]-3-yl)-1,3,5-triazine (T2T). The electron transport layer was formed by mixing TPM-TAZ(2,4,6-tris(3-(pyrimidin-5-yl)phenyl)-1,3,5-triazine) and Liq at a ratio of 5:5. The n-charge generation layer was formed by doping ((1,3,5-triazine-2,4,6-triyl)tris(benzene-3,1-diyl))tris(diphenylphosphine oxide) (PO-T2T) with Yb by 1%. The electron injection layer was formed through (of) Yb. The second electrode was formed by mixing Ag and Mg at a ratio of 10:1. The capping layer was formed through (of) N4,N4'-diphenyl-N4,N4'-bis(9-phenyl-9H-carbazol-3-yl)-[1,1'-biphenyl]-4,4'-diamine.

EXAMPLE 1

When forming an electron blocking layer of each stack in the device stacking structure described above, a green dopant Ir(ppy$_3$)(Tris[2-phenylpyridine]iridium(111)) was doped by 5%.

EXAMPLE 2

When forming a hole blocking layer of each stack in the device stacking structure described above, a green dopant Ir(ppy$_3$)(Tris[2-phenylpyridine]iridium(111)) was doped by 5%.

EXAMPLE 3

When forming an electron blocking layer and a hole blocking layer of each stack in the device stacking structure described above, a green dopant Ir(ppy$_3$)(Tris[2-phenylpyridine]iridium(111)) was doped by 5%.

COMPARATIVE EXAMPLE 1

An electron blocking layer and a hole blocking layer of each stack were formed according to the device stacking structure described above, except without doping a green dopant.

EXPERIMENTAL EXAMPLE 1

The driving voltage, current efficiency, and luminance lifespan of the light emitting device according to each of Examples 1 to 3 and the light emitting device according to Comparative Example 1 were measured and the results are shown in Table 1. The current efficiency was measured at a 1500 nit luminance. The luminance lifespan represents the time it took to exhibit a light emitting luminance of 95% of the initial light emitting luminance, that is, 95% lifespan time (T95) of the light emitting device.

TABLE 1

|  | Driving voltage (V) | Current efficiency (Cd/A) | Luminance lifespan (T95, hr) |
| --- | --- | --- | --- |
| Example 1 | 10.2 | 26.8 | 460 |
| Example 2 | 10.2 | 27.8 | 540 |
| Example 3 | 10.2 | 30.4 | 620 |
| Comparative Example 1 | 10.2 | 23.1 | 260 |

Figure 11:
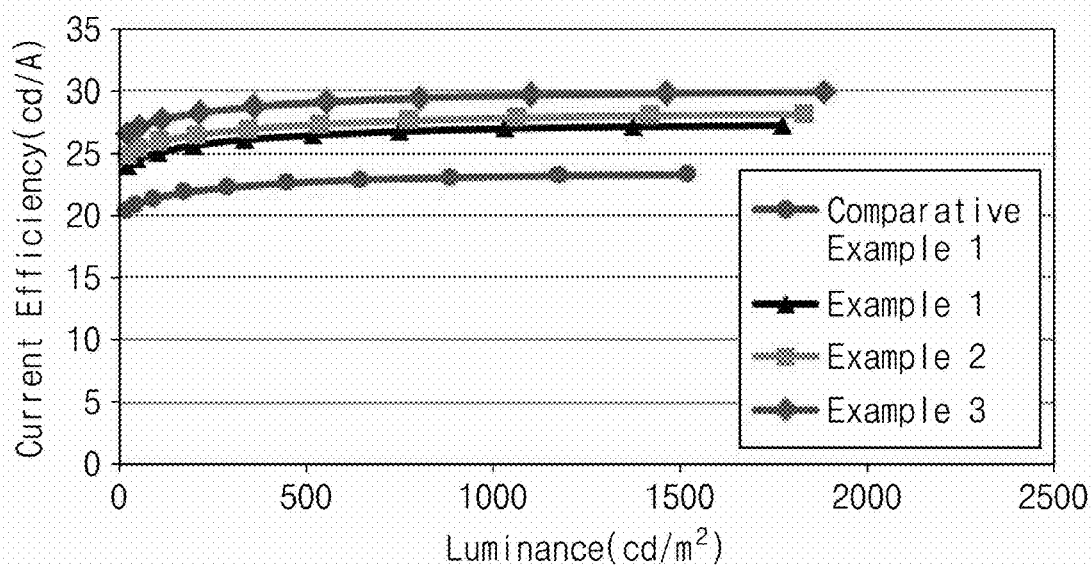
FIG. 11 is a graph showing the current efficiency of each of Examples and Comparative Examples according (relative) to luminance.

Referring to Table 1, in a three-stack tandem device including a blue dopant, the device of each of Examples 1 to 3 showed increased current efficiency and luminance lifespan, while maintaining the same driving voltage. Without being bound by any particular theory, it is believed that this beneficial effect is at least in part due to the hole blocking layer and/or the electron blocking layer of the present embodiments being adjacent to the light emitting layer and being doped with a green dopant. Particularly, the current efficiency and luminance lifespan of Example 3, in which both the hole blocking layer and the electron blocking layer adjacent to the light emitting layer were doped with a green dopant, were greatly increased compared with the rest of Examples and Comparative Example. The current efficiency according to luminance of the light emitting device according to each of Examples 1 to 3 and the light emitting device according to Comparative Example 1 was measured and shown in the graph of FIG. 11. Referring to the result of FIG. 11, in a three-stack tandem device including a blue dopant, when the hole blocking layer and/or the electron blocking layer adjacent to the light emitting layer were doped with a green dopant, the current efficiency was increased.

Figure 12:
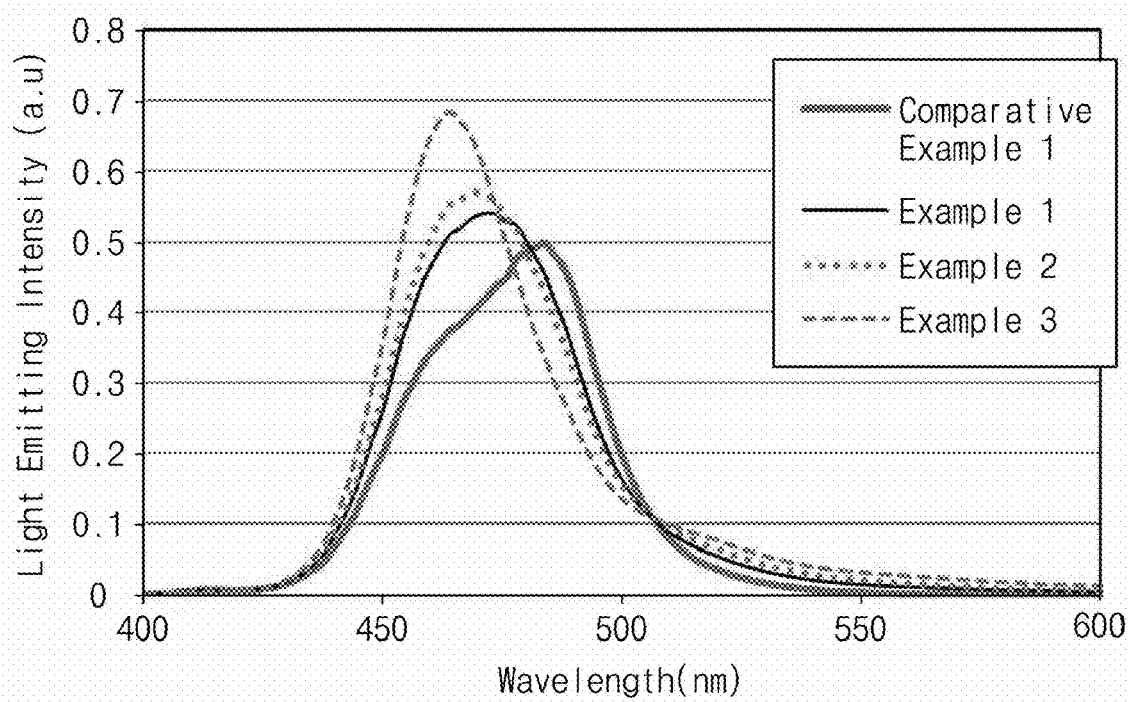
FIG. 12 is a graph showing the light emitting intensity of each of Examples and Comparative Examples according (relative) to a wavelength.

The light emitting intensity according to wavelength of the light emitting device according to each of Examples 1 to 3 and the light emitting device according to Comparative Example 1 was measured and shown in the graph of FIG. 12. Referring to the result of FIG. 12, it can be seen that when the hole blocking layer and/or the electron blocking layer adjacent to the light emitting layer were doped with a light emitting dopant, the light emitting intensity of the device was increased. In addition, in a three-stack tandem device including a blue dopant, it can be seen that the light emitting wavelength of each of Examples 1 to 3 was decreased to have a light emitting wavelength of a bluer color.

Figure 13:
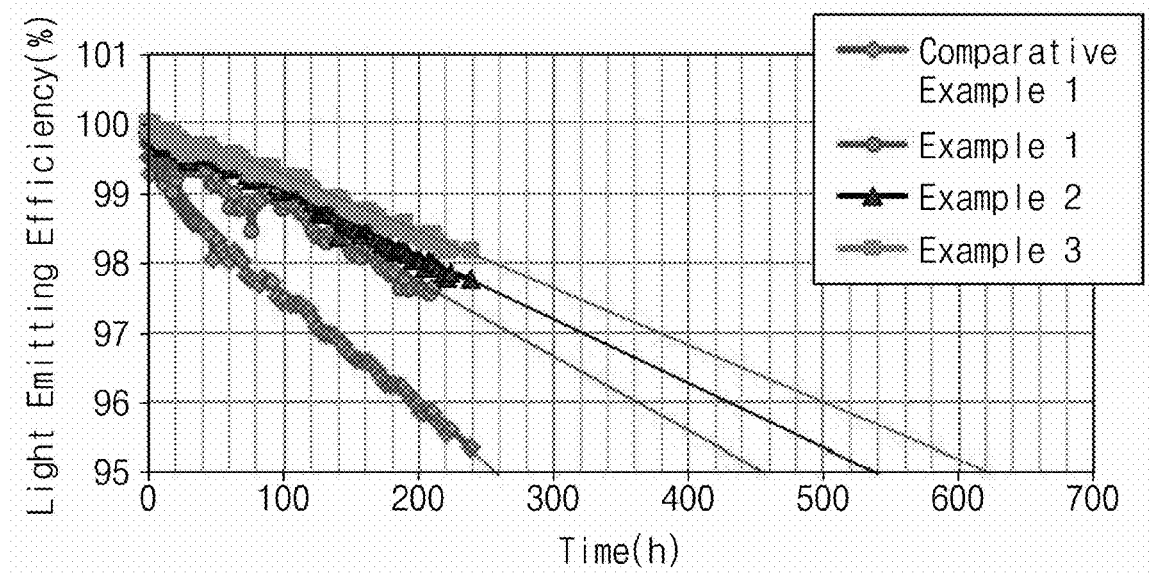
FIG. 13 is a graph showing the luminance efficiency of Examples and Comparative Examples over time.

The luminance efficiency over time of the light emitting device according to each of Examples 1 to 3 and the light emitting device according to Comparative Example 1 was measured and shown in the graph of FIG. 13. Referring to the result of FIG. 13, it can be seen that when the hole blocking layer and/or the electron blocking layer adjacent to the light emitting layer were doped with a light emitting dopant, the degree of decrease in luminance efficiency of the device decreased over time.

In a three-stack tandem device including a blue dopant, the light emitting device of each of the Examples may have increased device lifespan because the hole blocking layer and/or the electron blocking layer adjacent to the light emitting layer are doped with a green dopant to prevent (or protect) materials of an adjacent layer (e.g., a layer adjacent to a side of the hole blocking layer or the electron blocking facing oppositely away from the light emitting layer) from being deteriorated due to holes and/or electrons being leaked into the adjacent layer. In addition, through the generation of light by a dopant included in the adjacent layer (e.g., the light emitting layer), the light emitting efficiency of the device may be increased.

According to an embodiment of the present disclosure, organic layers adjacent to a light emitting layer of light emitting devices include a light emitting material, so that it may be possible to prevent (or reduce) damage to the organic layers due to a current leaked from the light emitting layer. Accordingly, the light emitting efficiency and device lifespan of a light emitting device may be improved.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present invention have been described herein, it is understood that the present invention should not be limited to these example embodiments but various changes and modifications can be made by one ordinary skilled in the art within the spirit and scope of the present invention as defined by the following claims and equivalents thereof.

Although the present disclosure has been described with reference to example embodiment of the present disclosure, it will be understood by those skilled in the art that various changes in form and details may be made therein without departing from the spirit and scope of the present disclosure.

Accordingly, the technical scope of the present disclosure is not intended to be limited to the contents set forth in the detailed description of the specification, but is intended to be defined by the appended claims and their equivalents.

What is claimed is:

1. A light emitting device comprising:
   a first electrode;
   a first stack on the first electrode;
   a first charge generation layer on the first stack;
   a second stack on the first charge generation layer; and
   a second electrode on the second stack, wherein
   the first stack comprises a first light emitting layer, a first hole transport region between the first electrode and the first light emitting layer, and a first electron transport region between the first light emitting layer and the first charge generation layer,
   the second stack comprises a second light emitting layer, a second hole transport region between the first charge generation layer and the second light emitting layer and a second electron transport region between the second light emitting layer and the second electrode,
   the first light emitting layer and the second light emitting layer are to generate blue light,
   the first hole transport region comprises a first hole injection layer, a first hole transport layer between the first hole injection layer and the first light emitting layer, and a first electron blocking layer between the first hole transport layer and the first light emitting layer,
   the first electron transport region comprises a first electron injection layer, a first electron transport layer between the first electron injection layer and the first light emitting layer, and a first hole blocking layer between the first electron transport layer and the first light emitting layer,
   the second hole transport region comprises a second hole injection layer, a second hole transport layer between the second hole injection layer and the second light emitting layer, and a second electron blocking layer between the second hole transport layer and the second light emitting layer,
   the second electron transport region comprises a second electron injection layer, a second electron transport layer between the second electron injection layer and the second light emitting layer, and a second hole blocking layer between the second electron transport layer and the second light emitting layer,
   at least one selected from the first electron blocking layer, the first hole blocking layer, the second electron blocking layer, and the second hole blocking layer comprises a light emitting material,
   the light emitting material is a material to generate green light, red light, and/or orange light having a higher wavelength than that of the light generated by the first light emitting layer and the second light emitting layer, and
   the at least one selected from the first electron blocking layer, the first hole blocking layer, the second electron blocking layer, and the second hole blocking layer, comprising the light emitting materials, comprises a base substance and the light emitting material doped in the base substance.

2. The light emitting device of claim 1, wherein each of the first electron blocking layer, the first hole blocking layer, the second electron blocking layer, and the second hole blocking layer comprises the light emitting material.

3. The light emitting device of claim 1, further comprising:
a second charge generation layer on the second stack; and
a third stack on the second charge generation layer.

4. The light emitting device of claim 1, wherein the base substance has a lowest triplet excitation energy level (T1) higher than that of the light emitting material.

5. The light emitting device of claim 1, wherein the light emitting material is a phosphorescent light emitting material.

6. The light emitting device of claim 1, wherein the first electrode is a reflective electrode, and the second electrode is either a transmissive electrode or a transflective electrode.

7. The light emitting device of claim 1, further comprising a capping layer on the second electrode.

8. A light emitting device comprising:
a first electrode;
a hole transport region on the first electrode;
a light emitting layer on the hole transport region and comprising a first light emitting material;
an electron transport region on the light emitting layer; and
a second electrode on the electron transport region,
wherein,
the hole transport region comprises a hole injection layer, a hole transport layer between the hole injection layer and the light emitting layer, and an electron blocking layer between the hole transport layer and the light emitting layer and being in contact with the light emitting layer,
the electron transport region comprises an electron injection layer, an electron transport layer between the electron injection layer and the light emitting layer, and a hole blocking layer between the electron transport layer and the light emitting layer and being in contact with the light emitting layer,
the electron blocking layer and the hole blocking layer comprise a second light emitting material different from the first light emitting material,
the first light emitting material is a material to generate blue light,
the second light emitting material is a material to generate green light, red light, and/or orange light having a higher wavelength than that of the first light emitting material, and
the electron blocking layer and the hole blocking layer comprising the second light emitting material each comprise a base substance and the second light emitting material doped in the base substance.

9. The light emitting device of claim 8, wherein,
a charge generation layer, a second hole transport region, a second light emitting layer, and a second electron transport region are sequentially stacked between the electron transport region and the second electrode,
the second hole transport region and the second electron transport region comprise at least one organic layer, and
a layer adjacent to the second light emitting layer comprises a third light emitting material different from the first light emitting material.

10. The light emitting device of claim 9, wherein the third light emitting material is the same material as the second light emitting material.

11. A display panel comprising:
a base substrate comprising a pixel region and a peripheral region adjacent to the pixel region; and
a plurality of display elements on the base substrate, to overlap the pixel region on a plane, wherein
each of the plurality of display elements comprises:
a first electrode;
a first stack on the first electrode;
a first charge generation layer on the first stack;
a second stack on the first charge generation layer; and
a second electrode on the second stack, wherein
the first stack comprises a first light emitting layer, a first hole transport region between the first electrode and the first light emitting layer, and a first electron transport region between the first light emitting layer and the first charge generation layer,
the second stack comprises a second light emitting layer, a second hole transport region between the first charge generation layer and the second light emitting layer and a second electron transport region between the second light emitting layer and the second electrode,
the first light emitting layer and the second light emitting layer are to generate blue light,
the first hole transport region comprises a first hole injection layer, a first hole transport layer between the first hole injection layer and the first light emitting layer, and a first electron blocking layer between the first hole transport layer and the first light emitting layer,
the first electron transport region comprises a first electron injection layer, a first electron transport layer between the first electron injection layer and the first light emitting layer, and a first hole blocking layer between the first electron transport layer and the first light emitting layer,
the second hole transport region comprises a second hole injection layer, a second hole transport layer between the second hole injection layer and the second light emitting layer, and a second electron blocking layer between the second hole transport layer and the second light emitting layer,
the second electron transport region comprises a second electron injection layer, a second electron transport layer between the second electron injection layer and the second light emitting layer, and a second hole blocking layer between the second electron transport layer and the second light emitting layer,
at least one selected from the first electron blocking layer, the first hole blocking layer, the second electron blocking layer, and the second hole blocking layer comprises a light emitting material,
the light emitting material is a material to generate green light, red light, and/or orange light having a higher wavelength than that of the light generated by the first light emitting layer and the second light emitting layer, and
the at least one selected from the first electron blocking layer, the first hole blocking layer, the second electron blocking layer, and the second hole blocking layer, comprising the light emitting materials, comprises a base substance and the light emitting material doped in the base substance.

12. The display panel of claim 11, further comprising a light control layer on the plurality of display elements and overlapping the pixel region on a plane.

13. The display panel of claim 12, wherein
the plurality of display elements are to generate a first light, and
the light control layer comprises:
a first light control unit to transmit the first light,
a second light control unit to convert the first light into a second light, and
a third light control unit to convert the first light into a third light.

14. The display panel of claim 13, wherein the first light has a wavelength region of 410 nm to 480 nm, the second light has a wavelength region of 500 nm to 570 nm, and the third light has a wavelength region of 625 nm to 675 nm.

15. The display panel of claim 12, wherein the light control layer comprises a base resin and a light emitting body dispersed in the base resin.

* * * * *